(12) United States Patent
Gambetta et al.

(10) Patent No.: US 11,386,348 B2
(45) Date of Patent: Jul. 12, 2022

(54) DYNAMIC QUANTUM DATA OUTPUT POST-PROCESSING

(71) Applicant: International Business Machines Corporation, Armonk, NY (US)

(72) Inventors: Jay Michael Gambetta, Yorktown Heights, NY (US); Ismael Faro Sertage, Chappaqua, NY (US); Francisco Jose Martin Fernandez, Chappaqua, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 275 days.

(21) Appl. No.: 16/890,792

(22) Filed: Jun. 2, 2020

(65) Prior Publication Data

US 2021/0374587 A1   Dec. 2, 2021

(51) Int. Cl.
*G06F 17/00* (2019.01)
*G06N 10/00* (2022.01)
(Continued)

(52) U.S. Cl.
CPC ............ *G06N 10/00* (2019.01); *G06F 3/0608* (2013.01); *G06F 3/0661* (2013.01);
(Continued)

(58) Field of Classification Search
CPC .......... G06N 10/00; G06N 20/00; G06N 5/04; G06F 3/0608; G06F 3/0661; G06F 3/0673; H03M 7/30
See application file for complete search history.

(56) References Cited

U.S. PATENT DOCUMENTS 10,152,454 B2   12/2018   Karimi et al.
10,484,479 B2   11/2019   Johnson et al.
(Continued)

FOREIGN PATENT DOCUMENTS

| CN | 108320027 | 7/2018 |
| WO | 2020033807 | 2/2020 |
| WO | 2020056176 | 3/2020 |

OTHER PUBLICATIONS

Sim et al., "A framework for algorithm deployment on cloud-based quantum computers," arXiv:1810.10576v1 [quant-ph], Oct. 24, 2018, 10 pages.

*Primary Examiner* — Joseph J Lauture
(74) *Attorney, Agent, or Firm* — Amin, Turocy & Watson, LLP

(57) ABSTRACT

Techniques for managing and compressing quantum output data (QOD) associated with quantum computing are presented. In response to receiving QOD from a quantum computer, a compressor component can compress QOD at first compression level to generate first compressed QOD, and can compress QOD at second compression level to generate second compressed QOD, the second compressed QOD can be less compressed than the first compressed QOD. Compressor management component (CMC) can determine whether first QOD includes sufficient data to enable it to be suitably processed by quantum logic. If so, CMC can allow first compressed QOD to continue to be sent to quantum logic and can discard second compressed QOD. If not sufficient, CMC can determine that second compressed QOD is to be processed by quantum logic. If CMC determines second compressed QOD does not include sufficient data, CMC can determine that the QOD is to be processed by quantum logic.

20 Claims, 9 Drawing Sheets

(51) Int. Cl.
*G06N 5/04* (2006.01)
*G06N 20/00* (2019.01)
*H03M 7/30* (2006.01)
*G06F 3/06* (2006.01)

(52) U.S. Cl.
CPC ............ *G06F 3/0673* (2013.01); *G06N 5/04* (2013.01); *G06N 20/00* (2019.01); *H03M 7/30* (2013.01)

(56) References Cited

U.S. PATENT DOCUMENTS

| 10,552,755 B2 | 2/2020 | Lanting et al. |
| 2021/0042652 A1* | 2/2021 | Das ........................ G06F 9/382 |

* cited by examiner

DYNAMIC QUANTUM DATA OUTPUT POST-PROCESSING

BACKGROUND

The subject disclosure relates to quantum computing using quantum circuits. Quantum computing employs quantum physics to encode and process information rather than binary digital techniques based on transistors. A quantum computing device can employ quantum bits (also referred to as qubits) that operate according to the laws of quantum physics and can exhibit phenomena such as superposition and entanglement. The superposition principle of quantum physics allows qubits to be in a state that partially represent both a value of "1" and a value of "0" at the same time. The entanglement principle of quantum physics allows qubits to be correlated with each other such that the combined states of the qubits cannot be factored individual qubit states. For instance, a state of a first qubit can depend on a state of a second qubit. As such, a quantum circuit can employ qubits to encode and process information in a manner that can be significantly different from binary digital techniques based on transistors.

Quantum computing can be utilized to perform quantum programming. Quantum programming can involve the process of assembling sequences of instructions, which can be called quantum programs, that can be capable of running on a quantum computer. Each quantum program can be associated with a collection of quantum circuits. When a quantum program is executed, a result can be produced by the quantum computer. This data result often can comprise a relatively large amount of data that has to go through various post-processing, with the post-processing data results being provided to the user or service (e.g., user or service requesting the data results) and/or being stored in a data store. It can take an undesirably long time to post-process the data results and them to the desired destination (e.g., user, service, or data store).

One approach for quantum computing and processing data involves a quantum processor unit that can be used to process a stream of input data. The quantum processor unit may operate as a quantum streaming kernel, which can preprocess data for a variety of classical or quantum data processing applications. The quantum processor unit can process the input data stream over time while producing an output data stream and maintaining a coherent quantum state that depends on the history of input data. In some cases, the output from the quantum processor unit can be combined with classical post-processing (e.g., a linear transformation), and the measured output bits in each time step may then be used to predict features about the streaming input signal. However, while this traditional approach describes preprocessing data for classical or quantum data processing applications, and combining the output from the quantum processor unit with classical post-processing e.g., a linear transformation) where measured output bits in each time step may be used to predict features about the streaming input signal, this traditional approach does not address the issue of post-processing data results, such as data results having a relatively large amount of data, produced as an output from a quantum computer to return post-processed data in a desirably fast manner to users or services desiring such data results.

Another approach for quantum computing and processing data relates to using a quantum autoencoder algorithm as a paradigm for compressing quantum data, that is, expressing a data set comprised of quantum states using a fewer number of qubits. However, this approach relates to implementing a quantum encoder algorithm for generic quantum circuits and does not address the issue of post-processing data results, such as data results having a relatively large amount of data, produced as an output from a quantum computer to return post-processed data in a desirably fast manner to users or services desiring such data results.

These and other deficiencies of traditional approaches for processing data associated with quantum computing can result in inefficient and/or ineffective data processing associated with quantum computing.

SUMMARY

The following presents a summary to provide a basic understanding of one or more embodiments of the disclosed subject matter. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, devices, structures, computer-implemented methods, apparatuses, and/or computer program products that can facilitate post-processing and compressing quantum output data are provided.

According to an embodiment, a system comprising a memory that stores computer-executable components; and a processor, operatively coupled to the memory, that executes computer-executable components. The computer-executable components can comprise a compressor component that, in response to receiving quantum output data, generates first compressed quantum output data based on compression of the quantum output data at a first compression level, wherein the first compressed quantum output data is provided to quantum logic. The computer-executable components also can include a compression management component that determines whether the first compressed quantum output data includes sufficient data to be processed by the quantum logic, based on a defined quantum logic processing criterion, to determine whether the quantum logic is to process second compressed quantum output data that is a less compressed version of the quantum output data than the first compressed quantum output data. Such embodiments of the system can provide a number of advantages, including that the system can more quickly and efficiently provide post-processing data results, which can be produced by the quantum logic from the quantum output data (as compressed or non-compressed), to a desired intended recipient (e.g., user, a service, a data store) of such data results.

In some embodiments, in response to determining that the first compressed quantum output data does not include the sufficient data to be processed by the quantum logic, the compression management component can determine that the second compressed quantum output data is to be processed by the quantum logic and can facilitate providing the second compressed quantum output data to the quantum logic for quantum logic processing. In certain embodiments, a machine learning component can adaptively determine or infer a second compression level and a compression algorithm to be used by a second compressor sub-component based on a result of performing a machine learning analysis on the first compressed quantum output data, previous data associated with previous quantum operations or a previous quantum program, or information relating to quantum circuits utilized by a quantum program to facilitate generation of the quantum output data or utilized by the previous quantum program to facilitate generation of previous quantum output data. These embodiments of the system can provide a number of advantages, including that the system can have the advantage of quickly and efficiently speeding up the post-processing of quantum output data and providing post-processed data results to an intended recipient, and/or can have the advantage of reducing the amount of data (e.g., amount of data of the data results) communicated to or stored by the intended recipient.

Another embodiment relates to a computer-implemented method that comprises, in response to receiving quantum output information, generating, by a system operatively coupled to a processor, first compressed quantum output information based on compressing the quantum output information at a first compression level, wherein the first compressed quantum output information is communicated to quantum logic. The computer-implemented method also comprises determining, by the system, whether the first compressed quantum output information has sufficient information to be processed by the quantum logic, in accordance with a defined quantum logic processing criterion, to determine whether the quantum logic is to process second compressed quantum output information that is a less compressed version of the quantum output information than the first compressed quantum output information. Such embodiment of the method can provide a number of advantages, including that the method can more quickly and efficiently provide post-processing information results, which can be produced by the quantum logic from the quantum output information (as compressed or non-compressed), to a desired intended recipient (e.g., user, a service, a data store) of such information results.

In certain embodiments, the method can further comprise, in response to determining that the first compressed quantum output information does not have the sufficient information to be processed by the quantum logic, determining, by the system, that the second compressed quantum output information is to be processed by the quantum logic, and communicating, by the system, the second compressed quantum output information to the quantum logic for quantum logic processing. Such embodiments of the method can provide a number of advantages, including that the method can have the advantage of quickly and efficiently speeding up the post-processing of quantum output information and providing post-processed information results to an intended recipient, and/or can have the advantage of reducing the amount of information (e.g., amount of information of the information results) provided to or stored by the intended recipient.

A further embodiment relates to a computer program product that facilitates compressing quantum output data generated by a quantum computing circuit, the computer program product comprising a computer readable storage medium having program instructions embodied therewith. The program instructions are executable by a processor to cause the processor to, in response to receiving the quantum output data, generate first compressed quantum output data, based on compression of the quantum output data at a first compression level, wherein the first compressed quantum output data can be provided to quantum logic. The program instructions also are executable by the processor to determine whether the first compressed quantum output data includes an amount of data points, associated with the quantum output data, that is sufficient to be processed by the quantum logic, in accordance with a defined quantum logic processing criterion, to determine whether the quantum logic is to process second compressed quantum output data, which can be a less compressed version of the quantum output data than the first compressed quantum output data.

In some embodiments, the program instructions also can be executable by the processor to, in response to determining that the first compressed quantum output data does not include the amount of the data points that is sufficient to be processed by the quantum logic, determine that the second compressed quantum output data is to be processed by the quantum logic, wherein the second compressed quantum output data can have a second data resolution that can be higher than a first data resolution of the first compressed quantum output data, and can transmit the second compressed quantum output data to the quantum logic for quantum logic processing. These embodiments of the computer program product can provide a number of advantages, including that the computer program product can have the advantage of quickly and efficiently increasing the speed of the post-processing of quantum output data and providing post-processed data results to an intended recipient, and/or can have the advantage of reducing the amount of data (e.g., amount of data of the data results) communicated to or stored by the intended recipient.

These and other features will become apparent from the following detailed description of illustrative embodiments thereof, which is to be read in connection with the accompanying drawings.

DETAILED DESCRIPTION

Figure 1:
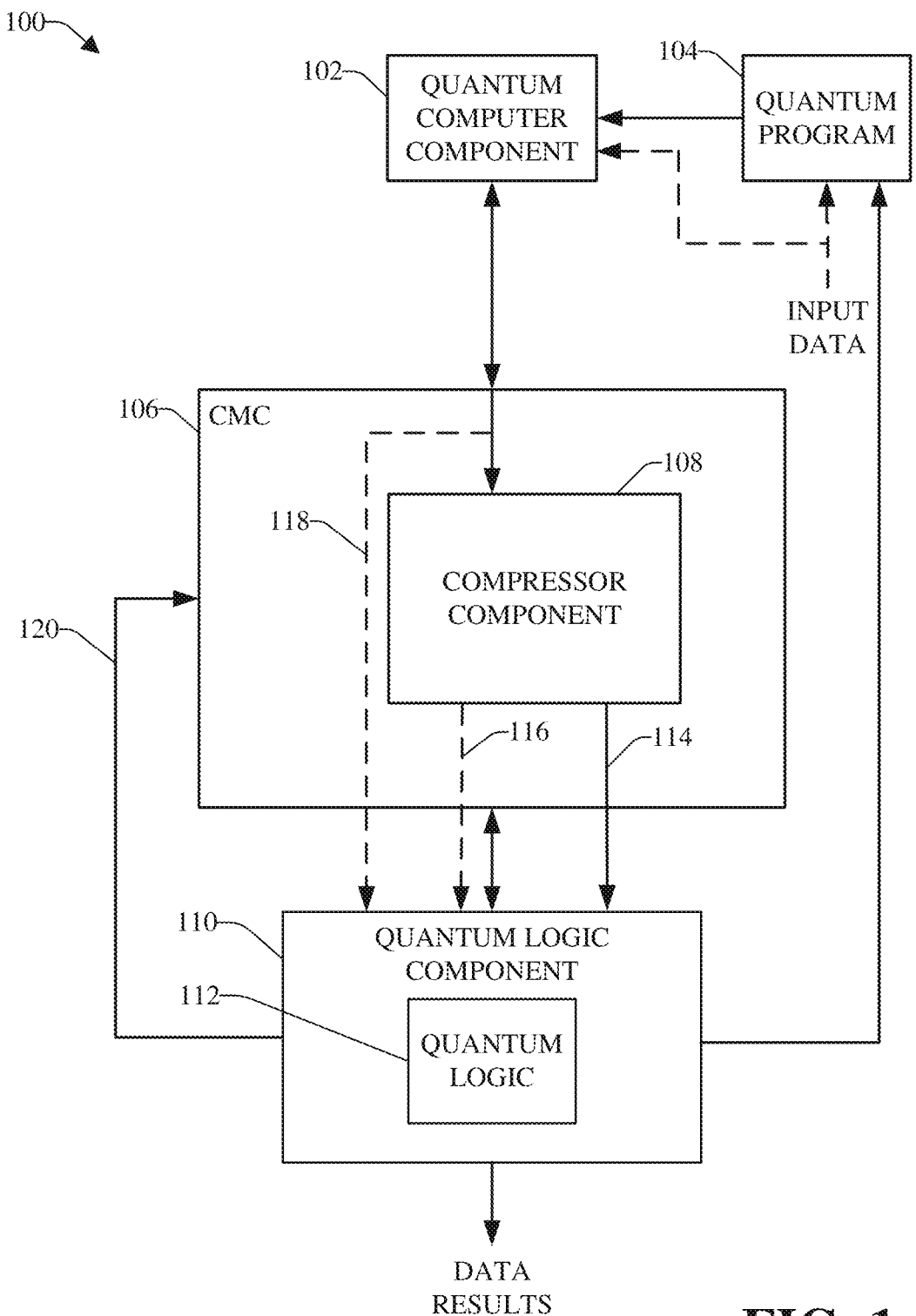
FIG. 1 illustrates a block diagram of an example, non-limiting system that can manage post-processing, including compression, of quantum output data that can be output as data results from a quantum computer, in accordance with various aspects and embodiments of the disclosed subject matter.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Quantum programming can involve the process of assembling sequences of instructions, which can be called quantum programs, that can be capable of running on a quantum computer. Each quantum program can be associated with a collection of quantum circuits. When a quantum program is executed, a data result can be produced by the quantum computer. This data result often can comprise a relatively large amount of data that has to go through various post-processing, with the post-processing data results being provided to the user or service (e.g., user or service requesting the data results) and/or being stored in a data store. It can take an undesirably long time to post-process the data results and them to the desired destination (e.g., user, service, or data store). It can be desirable to manage such data results (e.g., quantum output data) in a desirable (e.g., proper, suitable, or optimal) way to post-process the data results in a desirable (e.g., quick) manner and get the post-processed data results to the requesting device (e.g., the device that submitted the job request to the quantum computer) or other destination, so that it can be utilized (e.g., consumed) by users or services, and/or so that it can be stored in a data store.

One approach for quantum computing and processing data involves a quantum processor unit that can be used to process a stream of input data. The quantum processor unit may operate as a quantum streaming kernel, which can preprocess data for a variety of classical or quantum data processing applications. The quantum processor unit can process the input data stream over time while producing an output data stream and maintaining a coherent quantum state that depends on the history of input data. In some cases, the output from the quantum processor unit can be combined with classical post-processing (e.g., a linear transformation), and the measured output bits in each time step may then be used to predict features about the streaming input signal. However, while this traditional approach describes preprocessing data for classical or quantum data processing applications, and combining the output from the quantum processor unit with classical post-processing e.g., a linear transformation) where measured output bits in each time step may be used to predict features about the streaming input signal, this traditional approach does not address the issue of post-processing data results, such as data results having a relatively large amount of data, produced as an output from a quantum computer to return post-processed data in a desirably fast manner to users or services desiring such data results.

Another approach for quantum computing and processing data relates to using a quantum autoencoder algorithm as a paradigm for compressing quantum data, that is, expressing a data set comprised of quantum states using a fewer number of qubits. However, this approach relates to implementing a quantum encoder algorithm for generic quantum circuits and does not address the issue of post-processing data results, such as data results having a relatively large amount of data, produced as an output from a quantum computer to return post-processed data in a desirably fast manner to users or services desiring such data results.

The disclosed subject matter can be implemented to produce a solution to all or at least some of these problems and/or other problems with traditional quantum computing and post-processing techniques in the form of dynamic post-processing of quantum output data (QOD), including dynamically determining a compressed stream of QOD, having a certain compression level, that is suitable (e.g., contains sufficient data) to be processed, and is to be processed, by a quantum logic component, and/or dynamically, automatically, and/or adaptively determining a level of compression to apply to the stream of QOD to generate compressed QOD that is suitable to be processed by the quantum logic component.

To that end, the various aspects and embodiments herein relate to techniques for managing post-processing and compressing of QOD associated with quantum computing. The disclosed subject matter can comprise a quantum computer component that can receive a job request and associated input data. A quantum program can be associated with a set of quantum circuits of the quantum computer component and can execute a set of instructions (e.g., a sequence of instructions) and use the set of quantum circuits and a quantum algorithm to perform various quantum operations and/or analysis on the input data and/or other relevant data. Based at least in part on the quantum operations and/or analysis performed on the input data and/or other relevant data, and based at least in part on the set of quantum circuits and quantum algorithm, the quantum computer component (e.g., the quantum program running on the quantum computer component) can produce QOD as a data result that can be output from the quantum computer component.

The disclosed subject matter also can comprise a compressor component that can receive the QOD from the quantum computer component. In response to receiving the QOD from the quantum computer component, the compressor component (e.g., employing a first compressor sub-component) can compress the QOD (e.g., as converted from analog to digital form) at a first compression level (e.g., a higher compression level) to generate first compressed QOD (e.g., a first compressed stream) having a first data resolution. The compressor component (e.g., employing a second compressor sub-component) also can compress the QOD at a second compression level (e.g., a relatively lower compression level) to generate second compressed QOD (e.g., a second compressed stream) having a second data resolution. The second compressed QOD can be a less compressed version of the QOD than the first compressed QOD, and the second data resolution can have a relatively higher data resolution than the first data resolution.

The disclosed subject matter can comprise a quantum logic component that can utilize quantum logic (e.g., quantum algorithm logic) to facilitate post-processing the QOD (e.g., compressed or non-compressed QOD) to produce useful data results that can be provided to a user or service, or can be stored in a data store. The first compressed QOD can be provided to the quantum logic component for further processing, wherein the first compressed QOD can be processed based at least in part on the quantum logic employed by the quantum logic component. While processing the first compressed QOD, the quantum logic component can perform validation checks on the results of processing the first compressed QOD to determine whether the first compressed QOD includes sufficient data (e.g., sufficient data points) to enable the quantum logic component to desirably (e.g., suitably or acceptably) process the first compressed QOD using the quantum logic to produce a useful data result (e.g., post-processed data result) as an output from the quantum logic component.

In some embodiments, the compressor component also can communicate the second compressed QOD (e.g., second compressed stream) to the quantum logic component at or near the same time the compressor component is communicating the first compressed QOD (e.g., first compressed stream) to the quantum logic component. In certain embodiments, while the second compressed stream can be communicated to the quantum logic component at or near the same time as the first compressed stream, the quantum logic component typically will not process the second compressed stream if and while the quantum logic component is processing the first compressed stream. In such instances, if and while the quantum logic component is processing the first compressed stream, the second compressed stream can be stored in a data store (e.g., buffer component or other data store) of or associated with the quantum logic component.

The disclosed subject matter further can comprise a compressor management component (CMC) that can be associated with the quantum computer, the compressor component, and the quantum logic component. The CMC can manage the compression of the QOD, and also can manage the provision of compressed data streams or the non-compressed QOD to the quantum logic component. In some embodiments, the CMC can determine whether the first compressed QOD includes sufficient data to enable it to be desirably (e.g., suitably or acceptably) processed by the quantum logic component, based at least in part on feedback information (e.g., results of the validation checks) that can be received from the quantum logic component, and in accordance with defined quantum logic criteria (e.g., a quantum logic criterion that can indicate whether a stream of compressed data includes sufficient data to enable it to be suitably processed by the quantum logic component). If the CMC determines that the first compressed QOD includes sufficient data to enable it to be desirably processed by the quantum logic component, the CMC can allow the first compressed QOD to continue to be sent to and processed by the quantum logic component, and the CMC can discard or facilitate discarding the second compressed QOD (and the non-compressed QOD). If the CMC determines that the first compressed QOD does not include sufficient data to enable it to be desirably processed by the quantum logic component, the CMC can determine that the second compressed QOD is to be processed by the quantum logic component.

In certain embodiments, the CMC can continue to monitor the post-processing and can receive feedback information (e.g., results of the validation checks) regarding the second compressed QOD from the quantum logic component. Based at least in part on such feedback information, the CMC can determine whether the second compressed QOD includes sufficient data to enable it to be desirably processed by the quantum logic component, in accordance with the defined quantum logic criteria. If CMC determines the second compressed QOD does include sufficient data, the CMC can allow the second compressed QOD to continue to be sent to and processed by the quantum logic component, and the CMC can discard or facilitate discarding the QOD (e.g., the non-compressed QOD stream). If CMC determines that the second compressed QOD does not include sufficient data, the CMC can determine that the QOD is to be processed by the quantum logic component.

In some embodiments, the CMC can employ a machine learning component that can utilize machine learning techniques and algorithms, or artificial intelligence (AI) techniques and algorithms, to perform an analysis (e.g., machine learning analysis, AI analysis, or other analysis) on the first compressed QOD (or portion thereof), previous data associated with quantum computing, quantum programs, or quantum circuitry, and/or feedback information (e.g., results of validation checks) relating to the first compressed QOD. Based at least in part on the results of such analysis, the machine learning component can dynamically, automatically, and/or adaptively determine, infer, or learn a desirable (e.g., suitable or optimal) second compression algorithm and second compression level to use to compress the QOD to generate the second compressed QOD such that the second compressed QOD can contain, or at least can be predicted to contain, sufficient data to enable it to be desirably processed by the quantum logic component, in accordance with (e.g., to satisfy) the defined quantum logic criteria, as more fully described herein.

These and other aspects and embodiments of the disclosed subject matter will now be described with respect to the drawings.

FIG. 1 illustrates a block diagram of an example, non-limiting system 100 that can manage post-processing, including compression, of QOD that can be output as data results from a quantum computer, in accordance with various aspects and embodiments of the disclosed subject matter. The system 100 can comprise a quantum computer component 102 that can include various quantum devices, quantum circuitry, and/or other components (e.g., simulator components).

The system 100 also can comprise a quantum program 104 that can include a set of instructions (e.g., assembled sequence of instructions) that can be input to and run on the quantum computer component 102. The quantum program 104 can be associated with a collection of quantum devices, quantum circuitry, and/or other components of the quantum computer component 102, as indicated or determined by the instructions of the quantum program 104. The quantum program 104 or quantum computer component 102 can receive input data upon which various operations (e.g., quantum operations) can be performed when the quantum program 104 is executed, and data results, which also can be referred to as QOD, can be produced as a result of the execution of the quantum program 104 and the performance of operations on the input data and/or other data (e.g., other relevant data). The QOD produced by a quantum program 104 frequently can be a relatively large amount of data. It can be desirable to post-process such large amounts of QOD as quickly as possible, while still producing desirable (e.g., suitable, proper, and/or usable) post-process data results, so that such data results can be provided as quickly as is feasible to the user or service that is the intended recipient of such data results and/or to a data store for storage.

To facilitate desirably providing post-process data results in a quick and efficient manner, the system 100 can comprise a compression management component (CMC) 106 that can be associated with (e.g., communicatively connected to) the quantum computer component 102. The CMC 106 can desirably (e.g., efficiently, quickly, and optimally) manage post-processing, including compression, of QOD, which can be received from the quantum computer component 102, in accordance with defined compression management criteria and defined quantum logic criteria.

The CMC 106 can comprise a compressor component 108 that can employ one or more of various compression algorithms (e.g., lossless compression algorithms) to compress the QOD at various data resolution levels (e.g., various levels of precision). Different compression algorithms can compress the QOD at different speeds. For instance, a compression algorithm having a higher level of compression typically can compress the QOD at a relatively fast speed, but typically can produce compressed data that has a relatively lower data resolution level (e.g., relatively lower precision). Another compression algorithm having a relatively lower level of compression typically can compress the QOD at a relatively slower speed as compared to the higher compression level, but typically can produce compressed data that has a relatively higher data resolution level (e.g., relatively higher precision) than the compressed data produced by the higher compression level.

The CMC 106, including the compressor component 108, can be associated with (e.g., communicatively connected to) a quantum logic component 110, and can desirably (e.g., quickly, efficiently, and suitably) provide (e.g., communicate or stream) compressed QOD to the quantum logic component 110 for further post-processing. The quantum logic component 110 can comprise quantum logic 112 (e.g., quantum algorithm logic) that can process the compressed QOD to produce data results (e.g., post-processed data results) that can be provided to an intended recipient (e.g., user, service, or data store).

To facilitate desirable compression of the QOD, in accordance with various embodiments, the CMC 106 can dynamically determine (e.g., dynamically or automatically) determine and facilitate generating a compressed stream of QOD, having a certain compression level, that can be suitable (e.g., can contain sufficient data) to be desirably (e.g., suitably or properly) processed, and is to be processed, by the quantum logic component 110, in accordance with the defined quantum logic criteria. The defined quantum logic criteria can comprise one or more criterion that can indicate whether a stream of compressed data includes sufficient data to enable it to be suitably processed by the quantum logic component 110. In some embodiments, the CMC 106 can dynamically, automatically, and/or adaptively determine a level of compression to apply to the stream of QOD to generate compressed QOD that can be suitable to be processed by the quantum logic component 110, in accordance with the defined quantum logic criteria.

In response to receiving the QOD from the quantum computer component 102, the compressor component 108 can compress the QOD (e.g., as converted from analog to digital form) at a first compression level (e.g., a relatively higher compression level), using a first compression algorithm, to generate first compressed QOD 114 (e.g., a first stream of compressed QOD) that can have a first data resolution level (e.g., a relatively lower data resolution). The compressor component 108 also can compress the QOD at a second compression level (e.g., a relatively lower compression level)), using a second compression algorithm, to generate second compressed QOD 116 (e.g., a second stream of compressed QOD) that can have a second data resolution level. The second compressed QOD 116 can be a less compressed version of the QOD than the first compressed QOD 114, and the second data resolution level can have a relatively higher data resolution than the first data resolution level. In some embodiments, the compressor component 108 can begin compressing the QOD at the second compression level at the same time, or substantially same time (e.g., shortly after), the compressor component 108 begins compressing the QOD at the first compression level, such that the respective streams are being compressed in parallel. In other embodiments, the compressor component 108 can begin compressing the QOD at the second compression level at a desired time after the compressor component 108 begins compressing the QOD at the first compression level, such that at least portions of the respective streams are being compressed in parallel.

The CMC 106 can provide (e.g., can stream or communicate) the first compressed QOD 114 to the quantum logic component 110 for further processing. The quantum logic component 110 can process the first compressed QOD 114 using the quantum logic 112. While processing the first compressed QOD 114, the quantum logic component 110 can perform validation checks on the results of processing the first compressed QOD 114 to determine whether the first compressed QOD includes sufficient data (e.g., sufficient data points) to enable the quantum logic component 110 to desirably (e.g., suitably or acceptably) process the first compressed QOD 114 using the quantum logic 112 to produce a useful data result (e.g., post-processed data result) as an output from the quantum logic component 110, in accordance with the defined quantum logic criteria.

In some embodiments, the CMC 106 (e.g., the compressor component 108 of the CMC 106) also can communicate (e.g., stream) the second compressed QOD 116 to the quantum logic component 110 at or near the same time the CMC 106 is communicating the first compressed QOD 114 to the quantum logic component 110. In certain embodiments, while the second compressed QOD 116 can be communicated to the quantum logic component 110 at or near the same time as the first compressed QOD 114, the quantum logic component 110 typically will not process the second compressed QOD 116 if and while the quantum logic component 110 is processing the first compressed QOD 114. In such instances, if and while the quantum logic component 110 is processing the first compressed QOD 114, the second compressed QOD 116 can be stored in a data store (e.g., buffer component or other data store) (not shown in FIG. 1) of or associated with the quantum logic component 110.

In still other embodiments, the CMC 106 also can communicate (e.g., stream) the QOD 118 (non-compressed QOD) to the quantum logic component 110 at or near the same time the CMC 106 is communicating the first compressed QOD 114 and/or the second compressed QOD 116 to the quantum logic component 110. While the QOD 118 can be communicated to the quantum logic component 110 at or near the same time as the first compressed QOD 114 and/or the second compressed QOD 116, the quantum logic component 110 typically will not process the QOD 118 if and while the quantum logic component 110 is processing the first compressed QOD 114 or the second compressed QOD 116. In such instances, if and while the quantum logic component 110 is processing the first compressed QOD 114 or the second compressed QOD 116, the QOD 118 can be stored in the data store of or associated with the quantum logic component 110.

In some embodiments, the CMC 106 can receive feedback information 120 from the quantum logic component 110, wherein the feedback information 120 can comprise the validation check results relating to the processing of the first compressed QOD 114 by the quantum logic component 110. The CMC 106 can determine whether the first compressed QOD 114 includes sufficient data to enable it to be desirably (e.g., suitably or acceptably) processed by the quantum logic component 110, based at least in part on the feedback information 120 (e.g., results of the validation checks), and in accordance with (e.g., to satisfy) the defined quantum logic criteria (e.g., a quantum logic criterion that can indicate whether a stream of compressed data includes sufficient data to enable it to be suitably processed by the quantum logic component 110). For example, in determining whether the first compressed QOD 114 (or any data stream under evaluation) includes sufficient data, the CMC 106 can determine whether the first compressed QOD 114 includes an amount of data (e.g., a sufficient amount of data, or a sufficient amount of data points, in the portion of the data stream being evaluated) or has a data resolution level that satisfies (e.g., meets or exceeds) a defined threshold amount of data or a defined threshold data resolution level, respectively, in accordance with the defined compression management criteria and the defined quantum logic criteria, which, in part, can correspond to the defined compression management criteria with regard to whether there is sufficient data in the data stream to enable it to be suitably processed by the quantum logic component 110. The defined threshold amount of data or the defined threshold data resolution level each can indicate whether the amount of data or the data resolution level, respectively, is sufficient or suitable to enable such data stream to be desirably (e.g., suitably, properly, acceptably, or optimally) processed by the quantum logic 112 of the quantum logic component 110. If the defined threshold amount of data or defined threshold data resolution level is satisfied, the data stream (e.g., first compression QOD 114) can be desirably processed by the quantum logic 112. If the defined threshold amount of data or defined threshold data resolution level is not satisfied (e.g., is below the applicable threshold), the data stream (e.g., first compression QOD 114) is not able to be desirably processed by the quantum logic 112. If the CMC 106 determines that the first compressed QOD 114 includes sufficient data (e.g., satisfies the threshold data amount or data resolution level) to enable it to be desirably processed by the quantum logic component 110, the CMC 106 can allow the first compressed QOD 114 to continue to be sent to (e.g., streamed to) and processed by the quantum logic component 110, and the CMC 106 also can discard or facilitate discarding the second compressed QOD 116 (and the non-compressed QOD 118, except for any portion that remains to be compressed at the first compression level).

If, instead, the CMC 106 determines that the first compressed QOD 114 does not include sufficient data to enable it to be desirably processed by the quantum logic component 110, the CMC 106 can determine that the second compressed QOD 116 is to be processed by the quantum logic component 110. In such instance, the CMC 106 can continue the streaming of the second compressed QOD 116 to the quantum logic component 110 for further post-processing, can discontinue the streaming of the first compressed QOD 114 (e.g., if any such data remains to be streamed) to the quantum logic component 110, and can discard or facilitate discarding the first compressed QOD 114 (e.g., if any such data remains at the CMC 106).

In certain embodiments, the CMC 106 can continue to monitor the post-processing and can receive further feedback information 120 (e.g., results of the validation checks) regarding the second compressed QOD 116 from the quantum logic component 110. Based at least in part on such feedback information 120, the CMC 106 can determine whether the second compressed QOD 116 includes sufficient data to enable it to be desirably processed by the quantum logic component 110, in accordance with (e.g., to satisfy) the defined quantum logic criteria. If the CMC 106 determines that the second compressed QOD 116 does include sufficient data, the CMC 106 can allow the second compressed QOD 116 to continue to be sent to and processed by the quantum logic component 110, and the CMC 106 can discard or facilitate discarding the QOD 118 (e.g., the non-compressed QOD stream, except for any portion that remains to be compressed at the second compression level).

If, instead, based at least in part on the results of analyzing the feedback information 120, the CMC 106 determines that the second compressed QOD 116 does not include sufficient data to enable it to be desirably processed by the quantum logic component 110, the CMC 106 can determine that the QOD 118 is to be processed by the quantum logic component 110. In such instance, the CMC 106 can continue the streaming of the QOD 118 to the quantum logic component 110 for further post-processing, can discontinue the streaming of the second compressed QOD 116 (e.g., if any such data remains to be streamed) to the quantum logic component 110, and can discard or facilitate discarding the second compressed QOD 116 (e.g., if any such data remains at the CMC 106).

The disclosed subject matter, by respectively compressing the QOD 118 at respective compression levels, in parallel, and employing the CMC 106 to desirably (e.g., suitably, efficiently, and/or optimally) manage the respective compression of the QOD 118 and determine which compressed QOD stream is to be processed by the quantum logic component 110 at a given time, can have the advantage of quickly and efficiently speeding up the post-processing of data results (e.g., QOD) and providing the post-processed data results to an intended recipient (e.g., user, a service, a data store), and/or the advantage of reducing the amount of data (e.g., amount of data of the data results) communicated to or stored by the intended recipient, as compared to traditional techniques for handling quantum data results produced by a quantum computer.

Figure 2:
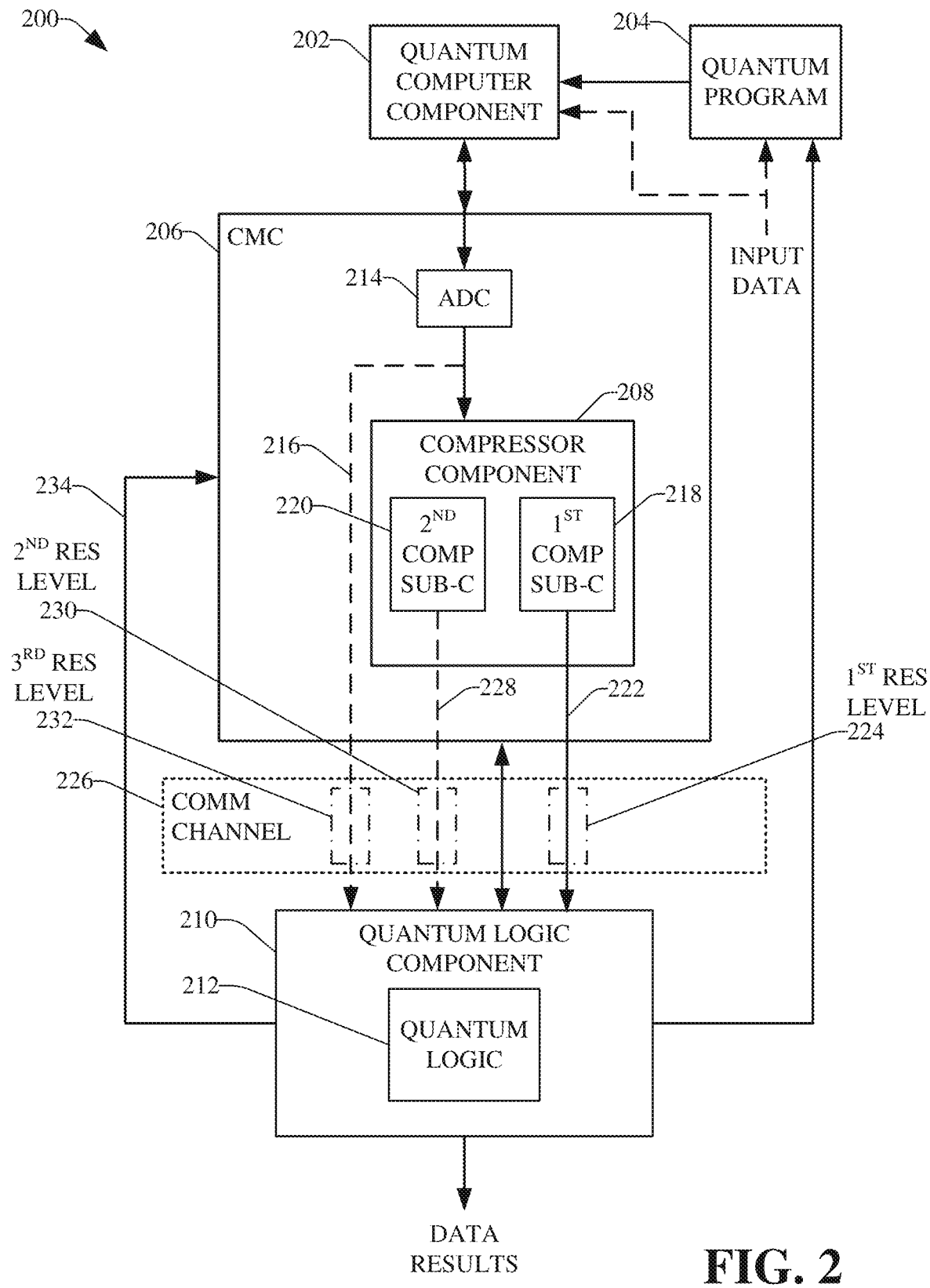
FIG. 2 depicts a block diagram of another example, non-limiting system that can manage post-processing, including compression, of quantum output data that can be output as data results from a quantum computer, in accordance with various aspects and embodiments of the disclosed subject matter.

Referring to FIG. 2, FIG. 2 depicts a block diagram of another example, non-limiting system 200 that can manage post-processing, including compression, of QOD that can be output as data results from a quantum computer, in accordance with various aspects and embodiments of the disclosed subject matter. Repetitive description of like elements employed in other embodiments described herein is or may be omitted for sake of brevity.

The system 200 can comprise a quantum computer component 202, a quantum program 204, a CMC 206, a compressor component 208, and a quantum logic component 210, which can include quantum logic 212 (e.g., quantum algorithm logic). The CMC 206 can comprise (as depicted in FIG. 2) or be associated with an analog-to-digital component (ADC) 214 that can receive the QOD, in analog form (e.g., as an analog streaming signal), from the quantum computer component 202 and can convert the analog QOD to digital QOD 216.

The compressor component 208 can receive the digital QOD 216 from the ADC 214. In some embodiments, the compressor component 208 can comprise a first compressor sub-component (1$^{st}$ COMP SUB-C) 218 (e.g., first compressor unit) and a second compressor sub-component (2$^{nd}$ COMP SUB-C) 220 (e.g., second compressor unit) that can receive the QOD 216 (e.g., digital QOD). In response to receiving the QOD 216, the first compressor sub-component 218 can compress the QOD 216 at a first compression level (e.g., a relatively higher compression level), based at least in part on a first compression algorithm, to generate first compressed QOD 222 (e.g., a first compressed stream) having a first data resolution level (1$^{st}$ RES LEVEL) 224. The CMC 206, employing the first compressor sub-component 218, can provide, via a communication channel (COMM CHANNEL) 226, the first compressed QOD 222 to the quantum logic component 210 for further processing. The quantum logic component 210 can process (e.g., further post-process), or at least begin to process, the first compressed QOD 222 based at least in part on the quantum logic 212 employed by the quantum logic component 210.

The second compressor sub-component 220 can compress the QOD at a second compression level (e.g., a relatively lower compression level than the first compression level), based at least in part on a second compression algorithm, to generate second compressed QOD 228 that can have a second data resolution level (2$^{nd}$ RES LEVEL) 230. The second compressed QOD 228 can be a less compressed version of the QOD 216 than the first compressed QOD 222, and the second data resolution level 230 can have a relatively higher data resolution than the first data resolution level 224.

In some embodiments, to facilitate determining the second compression level and/or second compression algorithm to be used by the second compressor sub-component 220, the CMC 206 can employ machine learning techniques and algorithms, or AI techniques and algorithms, to perform an analysis (e.g., machine learning analysis, AI analysis, or other analysis) on the first compressed QOD 222 (or portion thereof), previous data associated with the previous quantum computing, previous quantum programs, or quantum circuitry, and/or feedback information (e.g., results of validation checks) relating to the first compressed QOD 222. Based at least in part on the results of such analysis, the CMC 206 can dynamically, automatically, and/or adaptively determine, infer, or learn a desirable (e.g., suitable or optimal) second compression algorithm and the second compression level to use to compress the QOD 216 to generate the second compressed QOD 228 such that the second compressed QOD 228 can contain, or at least can be predicted to contain, sufficient data to enable it to be desirably processed by the quantum logic component 210, in accordance with (e.g., to satisfy) the defined quantum logic criteria, as more fully described herein.

Figure 3:
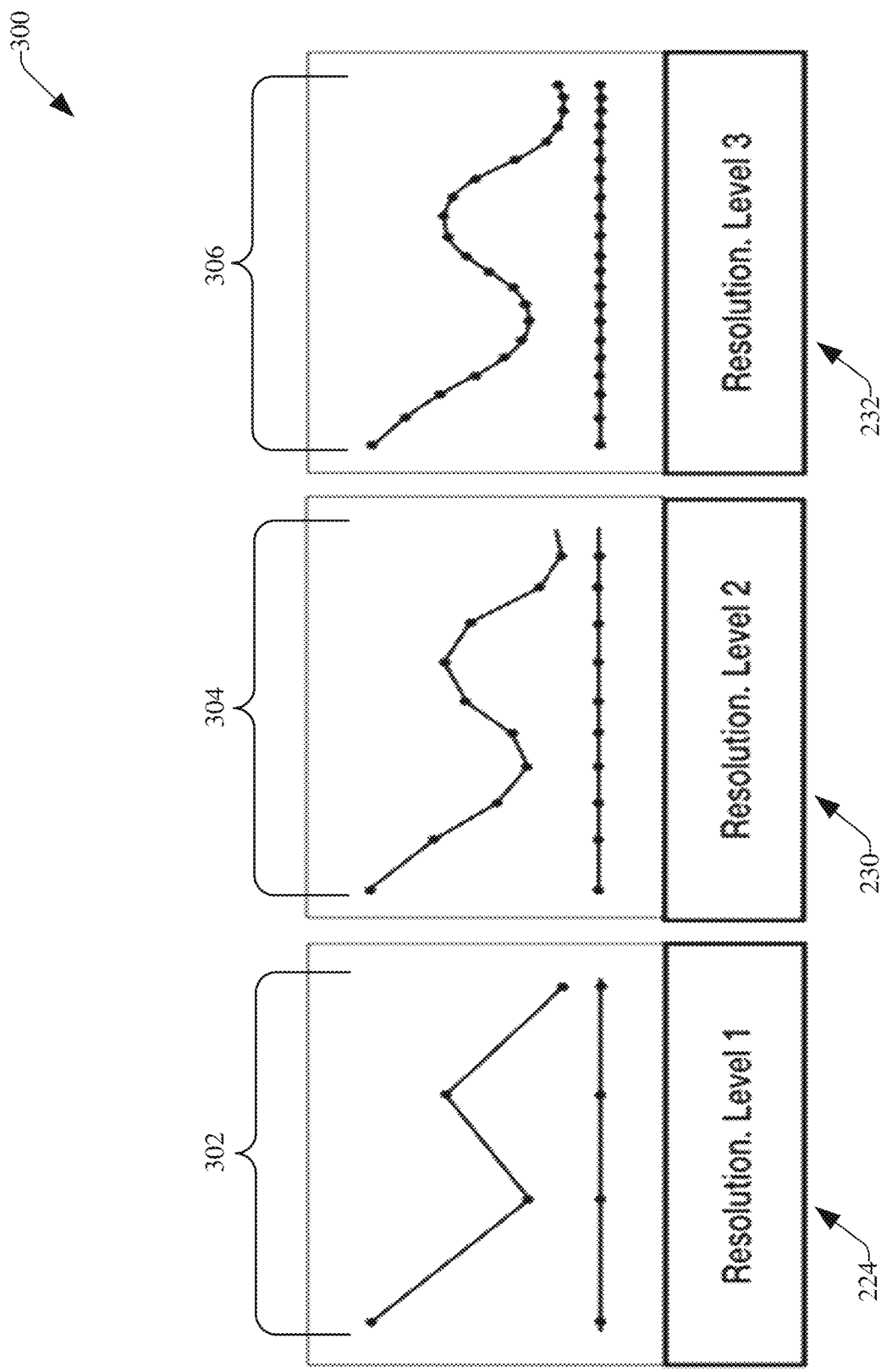
FIG. 3 presents diagrams of example data resolutions associated with respective data compression levels and a non-compressed level, in accordance with various aspects and embodiments of the disclosed subject matter.

Referring briefly to FIG. 3 (along with FIG. 2), FIG. 3 presents diagrams of example data resolutions 300 associated with respective data compression levels and a non-compressed level, in accordance with various aspects and embodiments of the disclosed subject matter. As can be observed in the example data resolutions 300, the first data resolution level 224 can comprise a first set (e.g., number) of data points 302, the second data resolution level 230 can comprise a second set of data points 304, and a third data resolution level (3$^{rd}$ RES LEVEL) 232 can comprise a third set of data points 306, wherein the third data resolution level 232, and associated third set of data points 306, can be associated with the QOD 216. As also can be observed from the example data resolutions 300, the second data resolution level 230 can be higher than the first data resolution level 224, and accordingly, the second set of data points 304 associated with the second data resolution level 230 can have more data points than the first set of data points 302 associated with the first data resolution level 224. Further, as can be observed from the example data resolutions 300, the third data resolution level 232 can be higher than the second data resolution level 230 as well as the first data resolution level 224, and accordingly, the third set of data points 306 associated with the third data resolution level 232 can have more data points than the second set of data points 304 associated with the second data resolution level 230 as well as the first set of data points 302 associated with the first data resolution level 224.

In some embodiments, the second compressor sub-component 220 can communicate the second compressed QOD 228 to the quantum logic component 210 at or near the same time the first compressor sub-component 218 is communicating the first compressed QOD 222 to the quantum logic component 210. In certain embodiments, while the second compressor sub-component 220 is communicating (e.g., streaming) the second compressed QOD 228 to the quantum logic component 210 at or near the same time as the first compressor sub-component 218 is communicating the first compressed QOD 222 to the quantum logic component 210, the quantum logic component 210 typically will not process the second compressed QOD 228 if and while the quantum logic component 210 is processing the first compressed QOD 222. In such instances, if and while the quantum logic component 210 is processing the first compressed QOD 222, the second compressed QOD 228 can be stored in a data store of or associated with the quantum logic component 210.

While processing the first compressed QOD 222, the quantum logic component 210 can perform validation checks on the results (e.g., post-processing data results) of processing the first compressed QOD 222 to determine whether the first compressed QOD 222 includes sufficient data to enable the quantum logic component 210 to desirably (e.g., suitably or acceptably) process the first compressed QOD 222 using the quantum logic 212 in order to produce a desirable (e.g., suitable, acceptable, or useful) data result (e.g., post-processed data result) as an output from the quantum logic component 210.

In some embodiments, the CMC 206 can determine whether the first compressed QOD 222 includes sufficient data to enable it to be desirably (e.g., suitably or acceptably) processed by the quantum logic component 210, based at least in part on feedback information 234 (e.g., results of the validation checks) that can be received from the quantum logic component 210, and in accordance with the defined quantum logic criteria. If the CMC 206 determines that the first compressed QOD 222 includes sufficient data to enable it to be desirably processed by the quantum logic component 210, the CMC 206 can allow the first compressor sub-component 218 to continue to send the first compressed QOD 222 to the quantum logic component 210 for processing by the quantum logic component 210, and the CMC 206 can discard or facilitate discarding the second compressed QOD 228 (and the non-compressed QOD 216, except for any portion of such QOD 216 that remains to be compressed by the first compressor sub-component 218).

If, instead, based at least in part on the results of analyzing the feedback information 234, the CMC 206 determines that the first compressed QOD 222 does not include sufficient data to enable it to be desirably processed by the quantum logic component 210, the CMC 206 can determine that the second compressed QOD 228 is to be processed by the quantum logic component 210, in accordance with the defined compression management criteria and the defined quantum logic criteria. In such instance, the CMC 206 can control the second compressor sub-component 220 to have the second compressor sub-component 220 continue to compress the QOD 216 at the second compression level to generate the second compressed QOD 228 and stream the second compressed QOD 228 to the quantum logic component 210 for further post-processing. The CMC 206 also can control the first compressor sub-component 218 to discontinue the compressing of the QOD 216 at the first compression level and discontinue the streaming of the first compressed QOD 222 (e.g., if any such data remains to be streamed) to the quantum logic component 210. The CMC 206 also can discard or facilitate discarding the first compressed QOD 222 (e.g., if any such data remains at the CMC 206).

The quantum logic component 210 can proceed to process the second compressed QOD 228, using the quantum logic 212. The quantum logic component 210 also can perform validation checks on the results (e.g., post-processing data results) of processing the second compressed QOD 228 to determine whether the second compressed QOD 228 includes sufficient data to enable the quantum logic component 210 to desirably process the second compressed QOD 228 using the quantum logic 212 in order to produce a desirable data result as an output from the quantum logic component 210, in accordance with the defined quantum logic criteria.

The CMC 206 can continue to monitor the post-processing and can receive further feedback information 234 (e.g., results of the validation checks) regarding the second compressed QOD 228 from the quantum logic component 210. Based at least in part on such feedback information 234, the CMC 206 can determine whether the second compressed QOD 228 contains sufficient data to enable it to be desirably processed by the quantum logic component 210, in accordance with (e.g., to satisfy) the defined quantum logic criteria. If the CMC 206 determines that the second compressed QOD 228 does contain sufficient data, the CMC 206 can control the second compressor sub-component 220 to have the second compressor sub-component continue to generate the second compressed QOD 228 and send it to the quantum logic component 210 for further processing, and the quantum logic component 210 can continue to process the second compressed QOD 228 using the quantum logic 212. The CMC 206 also can discard or facilitate discarding the QOD 216 (e.g., the non-compressed QOD stream, except for any portion of the QOD 216 that remains to be compressed at the second compression level).

If, instead, based at least in part on the results of analyzing the feedback information 234, the CMC 206 determines that the second compressed QOD 228 does not contain sufficient data to enable it to be desirably processed by the quantum logic component 210, the CMC 206 can determine that the QOD 216 is to be processed by the quantum logic component 210. In such instance, the CMC 206 can continue the streaming of the QOD 216 to the quantum logic component 210 for further post-processing by the quantum logic component 210. The CMC 206 also can control the second compressor sub-component 220 to discontinue the streaming of the second compressed QOD 228 (e.g., if any such data remains to be streamed) to the quantum logic component 210. The CMC 206 also can discard or facilitate discarding the second compressed QOD 228 (e.g., if any such data remains at the CMC 206).

The disclosed subject matter, by employing multiple compressor sub-components (e.g., 218 and 220) to respective compress the QOD 216 at respective compression levels and employing the CMC 206 to desirably (e.g., suitably, efficiently, and/or optimally) manage the respective compression of the QOD 216 and determine which compressed QOD stream is to be processed by the quantum logic component 210 at a given time, can have the advantage of quickly and efficiently speeding up the post-processing of data results (e.g., QOD) and providing the post-processed data results to an intended recipient (e.g., user, a service, a data store), and/or can have the advantage of reducing the amount of data (e.g., amount of data of the data results) communicated to or stored by the intended recipient, as compared to traditional techniques for handling quantum data results produced by a quantum computer. The disclosed subject matter, by employing machine learning techniques and algorithms, or AI techniques and algorithms, to dynamically, automatically, and/or adaptively determine, infer, or learn a desirable (e.g., suitable or optimal) compression algorithm (e.g., the second compression algorithm) and compression level (e.g., the second compression level) to use to compress QOD to generate compressed QOD such that the compressed QOD can include, or at least can be predicted to include, sufficient data to enable it to be desirably processed by the quantum logic, also can have the advantage of quickly and efficiently speeding up the post-processing of data results and providing the post-processed data results to an intended recipient, as compared to traditional techniques for handling quantum data results produced by a quantum computer.

Figure 4:
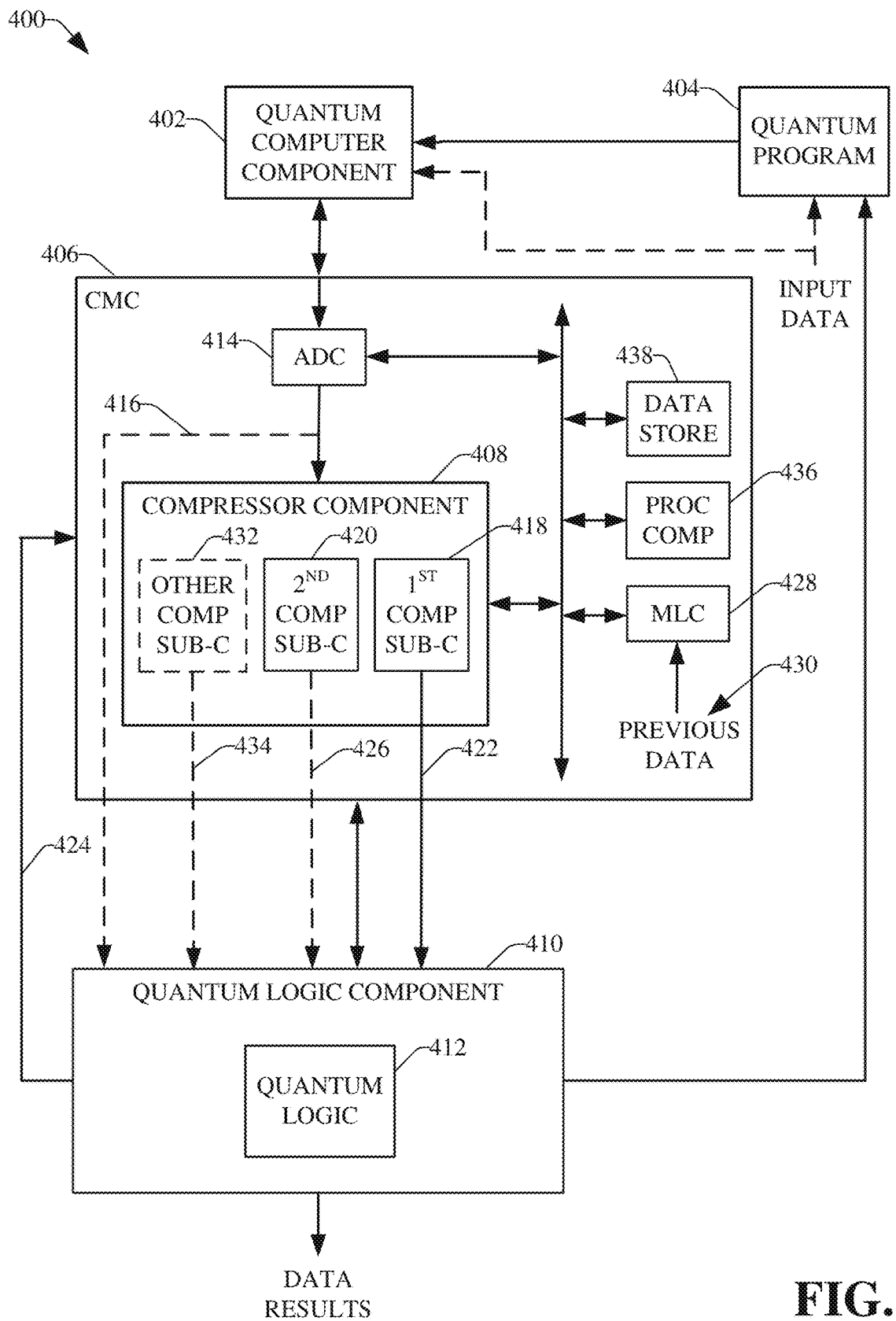
FIG. 4 illustrates a block diagram of an example, non-limiting system that can manage post-processing of quantum output data that can be output as data results from a quantum computer, and can employ machine learning or artificial intelligence (AI) techniques and algorithms to adaptively determine a desirable compression level for use in compressing quantum output data, in accordance with various aspects and embodiments of the disclosed subject matter.

Turning to FIG. 4, FIG. 4 illustrates a block diagram of an example, non-limiting system 400 that can manage post-processing of QOD that can be output as data results from a quantum computer, and can employ machine learning or AI techniques and algorithms to adaptively determine a desirable compression level for use in compressing QOD, in accordance with various aspects and embodiments of the disclosed subject matter. Repetitive description of like elements employed in other embodiments described herein is or may be omitted for sake of brevity.

The system 400 can comprise a quantum computer component 402, a quantum program 404, a CMC 406, a compressor component 408, and a quantum logic component 410, which can include quantum logic 412 (e.g., quantum algorithm logic). The CMC 406 can comprise (as depicted in FIG. 4) or be associated with an ADC 414 that can receive the QOD, in analog form (e.g., as an analog streaming signal), from the quantum computer component 402 and can convert the analog QOD to digital QOD 416.

The compressor component 408 can receive the digital QOD 416 from the ADC 414. In some embodiments, the compressor component 408 can comprise a first compressor sub-component 418 (e.g., first compressor unit) and a second compressor sub-component 420 (e.g., second compressor unit) that can receive the QOD 416. The first compressor sub-component 418 can compress the QOD 416 at a first compression level (e.g., a relatively higher compression level), based at least in part on a first compression algorithm, to generate first compressed QOD 422 (e.g., a first compressed stream) having a first data resolution level, as more fully described herein. The CMC 406, employing the first compressor sub-component 418, can provide the first compressed QOD 422 to the quantum logic component 410 for further processing. The quantum logic component 410 can process (e.g., further post-process), or at least begin to process, the first compressed QOD 422 based at least in part on the quantum logic 412 employed by the quantum logic component 410.

The quantum logic component 410 also can perform validation checks on the data results produced by the quantum logic component 410 to facilitate determining whether the first compressed QOD 422 is providing sufficient data to the quantum logic 412 to enable the quantum logic 412 to desirably (e.g., suitably, properly, or optimally) process the first compressed QOD 422 to produce desirable (e.g., suitable, proper, or usable) data results, in accordance with the defined quantum logic criteria. The CMC 406 can receive feedback information 424 from the quantum logic component 410, wherein the feedback information 424 can comprise the validation check results relating to the processing of the first compressed QOD 422 by the quantum logic component 410.

Based at least in part on the results of analyzing the feedback information 424, the CMC 406 can determine whether the first compressed QOD 422 includes sufficient data to enable the quantum logic 412 to desirably process the first compressed QOD 422, in accordance with the defined quantum logic criteria. Based at least in part on the results of such determination regarding the whether the first compressed QOD 422 includes sufficient data, the CMC 406 can determine whether the first compressed QOD 422 is to continue to be provided to and processed by the quantum logic component 410 or whether the quantum logic component 410 is to instead process second compressed QOD 426, having a second data resolution level (e.g., a higher data resolution level than the first data resolution level), that can be generated by the second compressor sub-component 420 compressing the QOD 416 at a second compression level (e.g., a relatively lower compression level than the first compression level).

In accordance with various embodiments, to facilitate determining a desirable second compression level and second compression algorithm, the CMC 406 can comprise a machine learning component (MLC) 428 that can employ machine learning techniques and algorithms, and/or AI techniques and algorithms, to dynamically, automatically, or adaptively determine, infer, or learn a desirable second compression level and second compression algorithm for desirably compressing the QOD 416 to produce second compressed QOD 426 that can be desirably processed, or at least can be predicted to be suitable to be desirably processed, by the quantum logic component 410 to enable the quantum logic component 410 to produce desirable (e.g., suitable, proper, or usable) data results. The machine learning component 428 can receive the first compressed QOD 422, or a portion of that first compressed data stream, from the first compressor sub-component 418. The machine learning component 428 also can receive previous data 430 relating to the previous quantum operations performed by the quantum computer component 402 and/or previous quantum programs from a data store (e.g., a data store of the CMC 406, the quantum computer component 402, or another component of the system 400). The previous data 430 can include, for example, previous QOD associated with previous quantum programs that have been executed by the quantum computer component 402, information regarding previous groups of quantum circuits and quantum devices of the quantum computer component 402 that were used with the previous quantum programs, and/or previous input data processed by the previous quantum programs. The previous data 430 also can include information relating to compression levels and compression algorithms that have previously been used, such as, for example, previous compression levels and compression algorithms that have produced desirable compressed QOD that includes sufficient data to satisfy the defined quantum logic criteria. In certain embodiments, the machine learning component 428 also can receive the feedback information 424 relating to the first compressed QOD 422 from the quantum logic component 410.

The machine learning component 428 can analyze (e.g., can perform a machine learning, AI analysis, or other analysis on) the first compressed QOD 422, the previous data 430 relating to the previous quantum operations, and/or the feedback information 424. As an example part of such analysis, the machine learning component 428 can look for patterns in the QOD 416 that are similar to patterns of previous QOD and/or other similarities between the QOD 416 and the previous QOD in relation to a compression level(s) and compression algorithm(s) that produced desirable compressed QOD (e.g., that satisfied the defined quantum logic criteria), can look for patterns in the first compressed QOD 422 that are similar to patterns of previous first compressed QOD and/or other similarities between the first compressed QOD 422 and the previous first compressed QOD in relation to a compression level(s) and compression algorithm(s) that produced desirable compressed QOD, and/or can look for patterns with regard to the quantum program 404 and associated quantum circuitry that are similar to patterns of previous quantum programs and associated quantum circuitry and/or other similarities between the quantum program 404 and associated quantum circuitry and the previous quantum programs and associated quantum circuitry in relation to a compression level(s) and compression algorithm(s) that produced desirable compressed QOD, etc.

Based at least in part on the results of the analysis (e.g., machine learning analysis, AI analysis, or other analysis), the machine learning component 428 can dynamically, automatically, or adaptively determine, infer, or learn a second compression level and second compression algorithm where compression of the QOD 416 at the second compression level, using the second compression algorithm, can produce second compressed QOD 426 that can include, or can be predicted to contain, sufficient data such that the second compressed QOD 426 can be desirably (e.g., suitably or properly) processed by the quantum logic component 410, in accordance with (e.g., to satisfy) the defined quantum logic processing criteria.

In some embodiments, the CMC 406 can control operation of the second compressor sub-component 420 and selection of the second compression level and second compression algorithm until the machine learning component 428 is able to perform the analysis on the first compressed QOD 422, the previous data 430 relating to the previous quantum operations, and/or the feedback information 424, and determine the second compression level and second compression algorithm to be used by the second compressor sub-component 420, in accordance with applicable compression management criteria. In such instances, the CMC 406 can have the second compressor sub-component 420 begin compressing the QOD 416 at the second compression level, based at least in part on the second compression algorithm, a relatively short time after the first compressor sub-component 418 starts compressing the QOD 416, for example, once the machine learning component 428 has determined the second compression level and second compression algorithm.

In other embodiments, the CMC 406 can select an initial second compression level and initial second compression algorithm to be used by the second compressor sub-component 420, and can control operation of the second compressor sub-component 420 to have the second compressor sub-component 420 begin compressing the QOD 416 at the initial second compression level, based at least in part on the initial second compression algorithm, at the same time or substantially the same time as the first compressor sub-component 418 begins compressing the QOD 416 at the first compression level, in accordance with applicable compression management criteria. The second compressor sub-component 420 can send the initial second compressed QOD to the quantum logic component 410 for storage (e.g., temporary storage or buffering) until the CMC 406 determines whether the initial second compressed QOD is to be processed by the quantum logic component 410, or whether the first compressed QOD 422 is to continue to be processed by the quantum logic component 410, or whether there is an adapted second compression level and adapted second compression algorithm, as determined by the machine learning component 428, that are to be used by the second compressor sub-component 420 instead of the initial second compression level and initial second compression algorithm.

If the CMC 406 determines that the adapted second compression level and adapted second compression algorithm are to be used by the second compressor sub-component 420, the CMC 406 can control the second compressor sub-component 420 to have it discontinue using the initial second compression level and initial second compression algorithm and begin using the adapted second compression level and adapted second compression algorithm, in accordance with the defined compression management criteria and the defined quantum logic criteria. In such case, the second compressor sub-component 420 can generate second compressed QOD (e.g., 426) at the adapted second compression level, based at least in part on the adapted second compression algorithm, and can send the second compressed QOD to the quantum logic component 410 for temporary storage until processed or discarded, or for processing by the quantum logic component 410 if the CMC 406 determines that the first compressed QOD 422 does not include sufficient data to be desirably processed by the quantum logic component 410 to satisfy the defined quantum logic criteria.

While the first compressed QOD 422 is being processed by the quantum logic component 410, the CMC 406 can determine whether the first compressed QOD 422 contains sufficient data to enable it to be desirably processed by the quantum logic component 410, based at least in part on the feedback information 424, and in accordance with the defined quantum logic criteria. If the CMC 406 determines that the first compressed QOD 422 includes sufficient data to enable it to be desirably processed by the quantum logic component 410, the CMC 406 can allow the first compressed QOD 422 to continue to be sent to (e.g., streamed to) and processed by the quantum logic component 410, and the CMC 406 also can discard or facilitate discarding the (initial or adapted) second compressed QOD 426 (and the non-compressed QOD 416, except for any portion that remains to be compressed at the first compression level).

If, instead, based at least in part on the results of analyzing the feedback information 424, the CMC 406 determines that the first compressed QOD 422 does not contain sufficient data to be desirably processed by the quantum logic component 410, the CMC 406 can determine that the (initial or adapted) second compressed QOD 426 is to be processed by the quantum logic component 410. In such instance, the CMC 406 can control the second compressor sub-component 420 to have the second compressor sub-component 420 continue to compress the QOD 416 at the (initial or adapted) second compression level to generate the (initial or adapted) second compressed QOD 426 and stream the second compressed QOD 426 to the quantum logic component 410 for further post-processing. The CMC 406 also can control the first compressor sub-component 418 to discontinue the compressing of the QOD 416 and discontinue the streaming of the first compressed QOD 422 (e.g., if any such data remains to be streamed) to the quantum logic component 410. The CMC 406 also can discard or facilitate discarding the first compressed QOD 422 (e.g., if any such data remains at the CMC 406).

The quantum logic component 210 can proceed to process the second compressed QOD 426, using the quantum logic 412. The quantum logic component 410 also can perform validation checks on the results (e.g., post-processing data results) of processing the second compressed QOD 426 to determine whether the second compressed QOD 426 includes sufficient data to enable the quantum logic component 410 to desirably process the second compressed QOD 426 using the quantum logic 412 in order to produce a desirable data result as an output from the quantum logic component 410, in accordance with the defined quantum logic criteria.

The CMC 406 can continue to monitor the post-processing and can receive further feedback information 424 (e.g., results of the validation checks) regarding the (initial or adapted) second compressed QOD 426 from the quantum logic component 410. Based at least in part on such feedback information 424, the CMC 406 can determine whether the second compressed QOD 426 contains sufficient data to enable it to be desirably processed by the quantum logic component 410, in accordance with (e.g., to satisfy) the defined quantum logic criteria. If the CMC 406 determines that the second compressed QOD 426 does contain sufficient data, the CMC 406 can control the second compressor sub-component 420 to have the second compressor sub-component 420 continue to generate the second compressed QOD 426 and send it to the quantum logic component 410 for further processing, and the quantum logic component 410 can continue to process the second compressed QOD 426 using the quantum logic 412. The CMC 406 also can discard or facilitate discarding the QOD 416 (e.g., the non-compressed QOD stream, except for any portion of the QOD 416 that remains to be compressed at the second compression level).

If, instead, based at least in part on the results of analyzing the feedback information 424, the CMC 406 determines that the second compressed QOD 426 does not contain sufficient data to enable it to be desirably processed by the quantum logic component 410, the CMC 406 can determine that the QOD 416 is to be processed by the quantum logic component 410. In such instance, the CMC 406 can continue the streaming of the QOD 416 to the quantum logic component 410 for further post-processing by the quantum logic component 410. The CMC 406 also can control the second compressor sub-component 420 to discontinue the streaming of the second compressed QOD 426 (e.g., if any such data remains to be streamed) to the quantum logic component 410. The CMC 406 also can discard or facilitate discarding the second compressed QOD 426 (e.g., if any such data remains at the CMC 406).

In certain embodiments, the compressor component 408 can comprise (e.g., optionally can comprise) another compressor sub-component(s) (OTHER COMP SUB-C) 432 (e.g., a third compressor sub-component) that can compress the QOD 416 at another (e.g., third) compression level using another (e.g., third) compression algorithm. In such embodiments, if the second compressed QOD 426 is determined to not contain sufficient data for desirable processing by the quantum logic component 410, the CMC 406 can switch to the other compressor sub-component 432 (instead of switching to the non-compressed QOD 416) to have the other compressor sub-component 432 compress the QOD 416 at the other compression level (e.g., a lower compression level than the second compression level), based at least in part on the other compression algorithm, to generate another (e.g., third) compressed QOD 434 that can be sent to the quantum logic component 410 for processing. If, after further monitoring and analysis, the CMC 406 determines that none of the compressed QOD streams are suitable for processing by the quantum logic component 410, the CMC 406 can determine that the non-compressed QOD 416 is to be processed by the quantum logic component 410.

The system 400 also can comprise a processor component (PROC COMP) 436 that can work in conjunction with the other components (e.g., the CMC 406, quantum logic component 410, and/or data store 438, . . . ) to facilitate performing the various functions of the system 400. The processor component 436 can employ one or more processors, microprocessors, or controllers that can process data, such as information relating to QOD, compressed QOD, quantum programs, quantum circuitry, quantum devices, quantum algorithm logic, feedback information, defined compression management criteria, defined quantum logic criteria, data compression algorithms, machine learning algorithms, AI algorithms, ADC algorithms, traffic flows, policies, protocols, interfaces, tools, and/or other information, to facilitate operation of the system 400, as more fully disclosed herein, and control data flow between the system 400 and other components (e.g., quantum computer component 402, quantum programs, data storage devices, user devices or end-point devices, or other computing or communication devices) associated with (e.g., connected to) the system 400.

The data store 438 can store data structures (e.g., user data, metadata), code structure(s) (e.g., modules, objects, hashes, classes, procedures) or instructions, information relating to QOD, compressed QOD, quantum programs, quantum circuitry, quantum devices, quantum algorithm logic, feedback information, defined compression management criteria, defined quantum logic criteria, data compression algorithms, machine learning algorithms, AI algorithms, ADC algorithms, traffic flows, policies, protocols, interfaces, tools, and/or other information, to facilitate controlling operations associated with the system 400. In an aspect, the processor component 436 can be functionally coupled (e.g., through a memory bus) to the data store 438 in order to store and retrieve information desired to operate and/or confer functionality, at least in part, to the CMC 406, quantum logic component 410, and/or data store 438, etc., and/or substantially any other operational aspects of the system 400.

Figure 5:
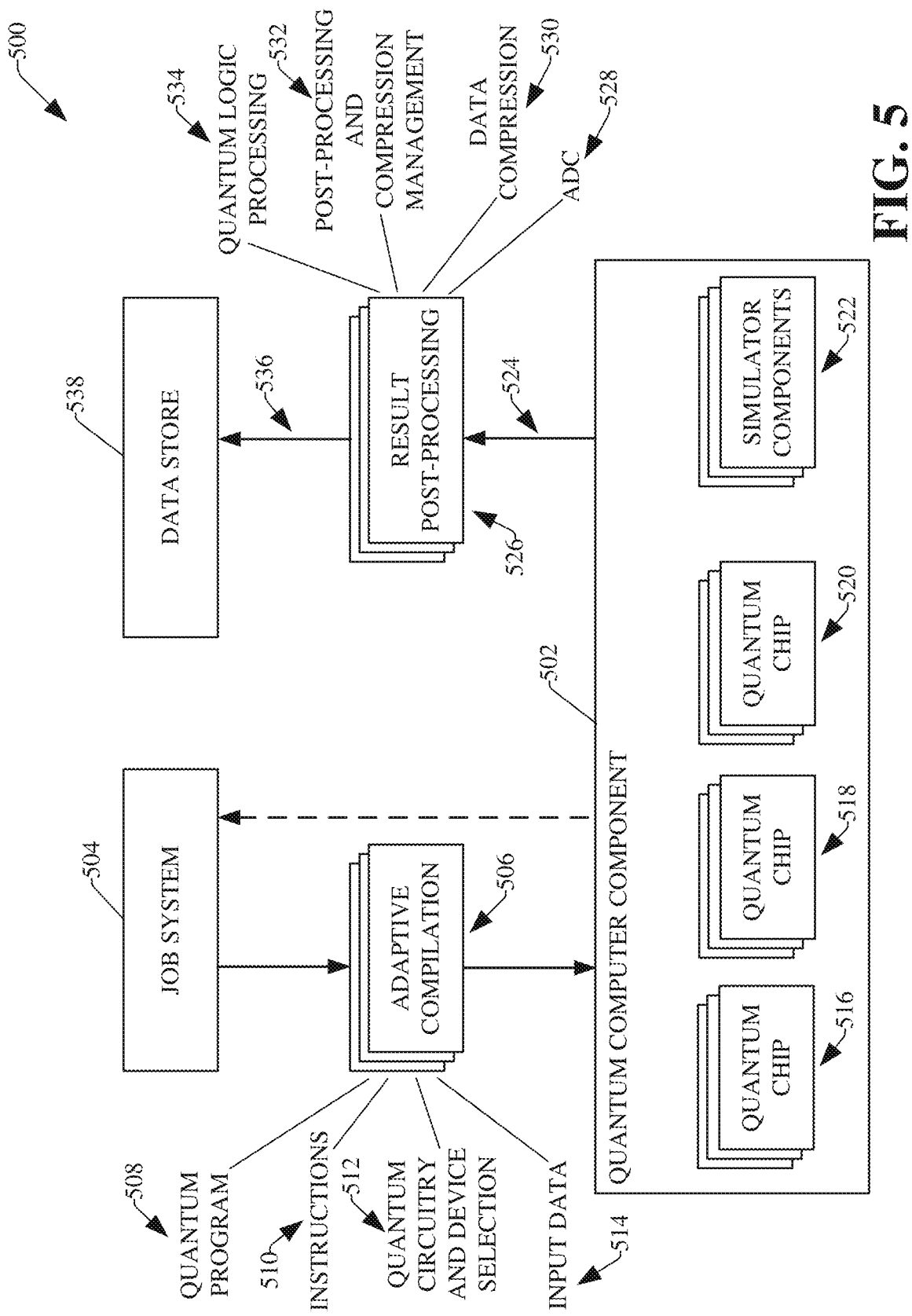
FIG. 5 depicts a block diagram of still another example, non-limiting system that can manage post-processing, including compression, of quantum output data that can be output as data results from a quantum computer, in accordance with various aspects and embodiments of the disclosed subject matter.

Referring to FIG. 5, FIG. 5 depicts a block diagram of still another example, non-limiting system 500 that can manage post-processing, including compression, of QOD that can be output as data results from a quantum computer, in accordance with various aspects and embodiments of the disclosed subject matter. The system 500 can comprise a quantum computer component 502, which can comprise various quantum units that can be utilized to perform quantum operations on data to produce QOD (e.g., quantum data results). The system 500 also can include a job system 504 that can generate job requests and send the job requests for processing by the quantum computer component 502. In connection with sending a job request to the quantum computer component 502, adaptive compilation 506 can be performed to facilitate putting information and instructions relating to the job requests in a desirable format for the quantum computer component 502 so that the quantum computer component 502 can be able to process the job request. The adaptive compilation 506 can involve or relate to the generation of a quantum program 508, generation or assembling of instructions 510 associated the quantum program 508, the determination and/or selection of quantum circuitry and quantum devices 512 for use in processing the job request, and/or input data 514 associated with the job request. Information (e.g., formatted information and instructions) from the adaptive compilation 506 can be forwarded to the quantum computer component 502 for processing by the quantum computer component 502.

The quantum computer component 502 can comprise a set of quantum chips, such as quantum chip 516, quantum chip 518, and quantum chip 520, wherein each of the quantum chips (e.g., 516, 518, 520, . . . ) can comprise respective quantum devices and respective quantum circuitry that can be used to perform various quantum operations on data, in response to execution of the quantum program 508 (e.g., execution of the instructions of the quantum program 508) by the quantum computer component 502. The quantum computer component 502 also can comprise a set of simulator components 522, wherein a simulator component can simulate or emulate the execution or operation of quantum circuitry and quantum devices. In some embodiments or implementations, one or more simulator components of the set of simulator components 522 can be utilized to facilitate simulating or emulating the performance of certain tasks or operations by quantum circuitry and quantum devices. Such simulation can be performed, for example, when it is not feasible to perform such certain tasks or operations using actual quantum circuitry and quantum devices (e.g., using the set of quantum chips (e.g., 516, 518, 520)).

In response to executing the quantum program 508 and processing the input data 514, the quantum computer component 502 can produce QOD 524 (e.g., quantum data results) as an output. Result post-processing 526 can be performed on the QOD 524 to generate post-process data results. As part of the result post-processing 526, analog-to-digital conversion (ADC) 528 can be performed to convert the analog QOD 524 to digital QOD, data compression 530 can be performed to compress the digital QOD, wherein post-processing and compression management 532 (e.g., by the CMC) can control the post-processing of the QOD 524, including the compression of the digital QOD. The result post-processing 526 also can include quantum logic processing 534 to applying the quantum logic (e.g., quantum algorithm logic) to the compressed QOD to generate post-processed data results 536. The post-processed data results can be stored in data storage 538 and/or can be provided to a desired recipient, such as a user, a service, or a requesting device.

The systems and/or devices have been (or will be) described herein with respect to interaction between several components. It should be appreciated that such systems and components can include those components or sub-components specified therein, some of the specified components or sub-components, and/or additional components. Sub-components could also be implemented as components communicatively coupled to other components rather than included within parent components. Further yet, one or more components and/or sub-components may be combined into a single component providing aggregate functionality. The components may also interact with one or more other components not specifically described herein for the sake of brevity, but known by those of skill in the art.

Figure 6:
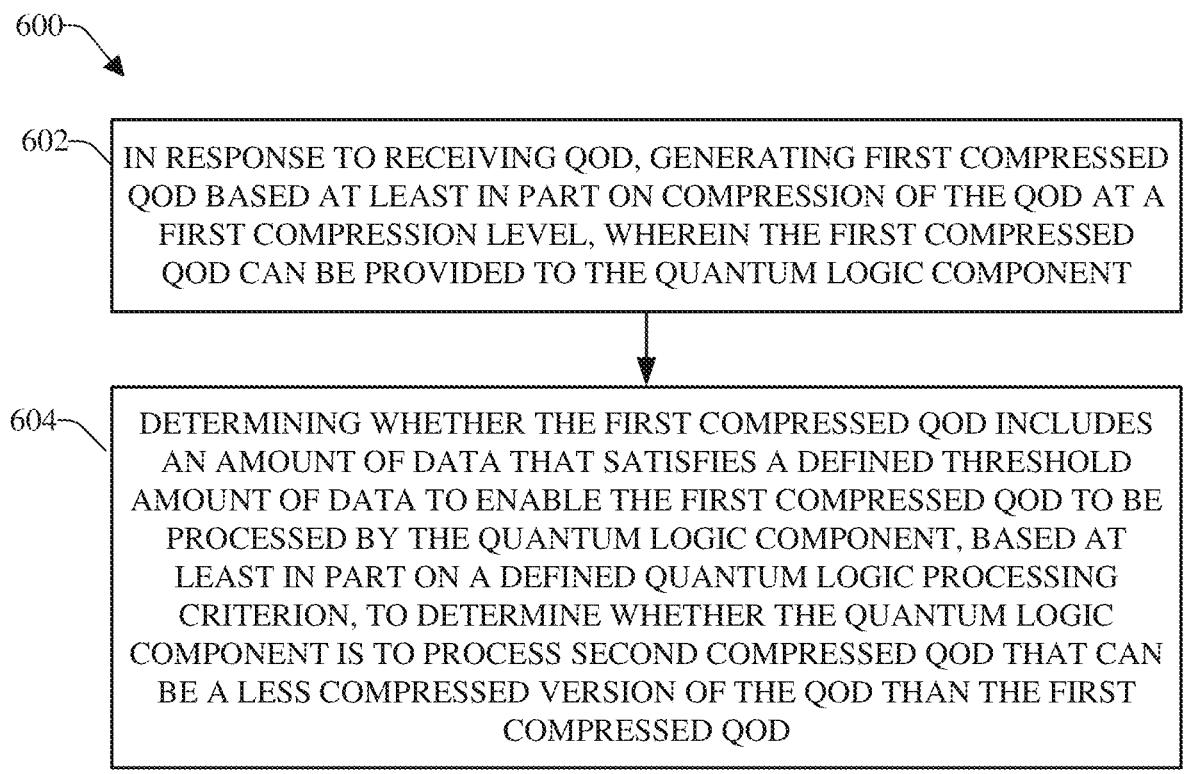
FIG. 6 illustrates a flow diagram of an example, non-limiting method that can control post-processing, including compression, of quantum output data that can be output as data results from a quantum computer, in accordance with various aspects and embodiments of the disclosed subject matter.

FIG. 6 illustrates a flow diagram of an example, non-limiting method 600 that can control post-processing, including compression, of QOD that can be output as data results from a quantum computer, in accordance with various aspects and embodiments of the disclosed subject matter. In some embodiments, the method 600 can be performed by, for example, a CMC, a compressor component, and/or a processor component, which can be associated with a data store. Repetitive description of like elements employed in other embodiments described herein is or may be omitted for sake of brevity.

At 602, in response to receiving QOD, first compressed QOD can be generated based at least in part on compression of the QOD at a first compression level, wherein the first compressed QOD can be provided to the quantum logic component. The compressor component can receive the QOD (e.g., as converted from analog to digital form) from the quantum computer, which can produce the QOD (e.g., quantum output information) as data results based at least in part on input data that is input to the quantum computer, a quantum program and associated instructions that can be executed on the quantum computer, comprising a collection of quantum circuits and quantum devices, to perform operations on the input data and/or other data (e.g., other relevant data). The CMC can control compression of the QOD to have the compressor component (e.g., employing a first compressor sub-component) compress the QOD at the first compression level. Based at least in part on the compression of the QOD at the first compression level, the compressor component can generate the first compressed QOD, which can have a first data resolution. The compressor component can provide the first compressed QOD to the quantum logic component for further processing.

At 604, a determination can be made regarding whether the first compressed QOD includes an amount of data that satisfies a defined threshold amount of data to enable the first compressed QOD to be processed by the quantum logic component, based at least in part on a defined quantum logic processing criterion, to determine whether the quantum logic component is to process second compressed QOD that can be a less compressed version of the QOD than the first compressed QOD. In addition to the compressor component (e.g., employing the first compressor sub-component) compressing the QOD at the first compression level, the compressor component (e.g., employing a second compressor sub-component) can compress the QOD at a second compression level to generate second compressed QOD having a second data resolution, which can be higher than the first data resolution. The CMC can determine whether the first compressed QOD (e.g., first compressed quantum output information) includes an amount of data (e.g., sufficient data) (or has a data resolution level) that satisfies (e.g., meets or exceeds) a defined threshold amount of data (or a defined threshold data resolution level) to enable the first compressed QOD to be desirably processed (e.g., suitably or properly processed) by the quantum logic component (e.g., quantum algorithm logic of the quantum logic component), based at least in part on the defined quantum logic processing criterion, which can indicate whether a stream of compressed data includes sufficient data to enable it to be suitably or properly processed by the quantum logic component. Based at least in part on the result of determining whether the first compressed QOD includes the amount of data (or has the data resolution level) that satisfies the defined threshold amount of data (or has a data threshold level that satisfies the defined threshold data resolution level) to be desirably processed by the quantum logic component, the CMC can determine whether the quantum logic component is to process the second compressed QOD, wherein the second compressed QOD can be a less compressed version of the QOD than the first compressed QOD.

For instance, if the CMC determines that the first compressed QOD includes an amount of data that satisfies the defined threshold amount of data to be desirably processed by the quantum logic component, the CMC can determine that the quantum logic component can continue to process the first compressed QOD, can determine that the quantum logic component does not have to be provided the second compressed QOD, and can discard or facilitate discarding the second compressed QOD (and the non-compressed QOD, except for any portion of the QOD that still remains to be compressed at the first compression level). Conversely, if the CMC determines that the first compressed QOD does not include an amount of data sufficient to satisfy the defined threshold amount of data and enable it to be desirably processed by the quantum logic component, the CMC can determine that the quantum logic component is to be provided and is to process the second compressed QOD, can determine that the quantum logic component can discontinue processing the first compressed QOD, and can discard or facilitate discarding the first compressed QOD, or at least any remaining portion thereof.

Figure 7:
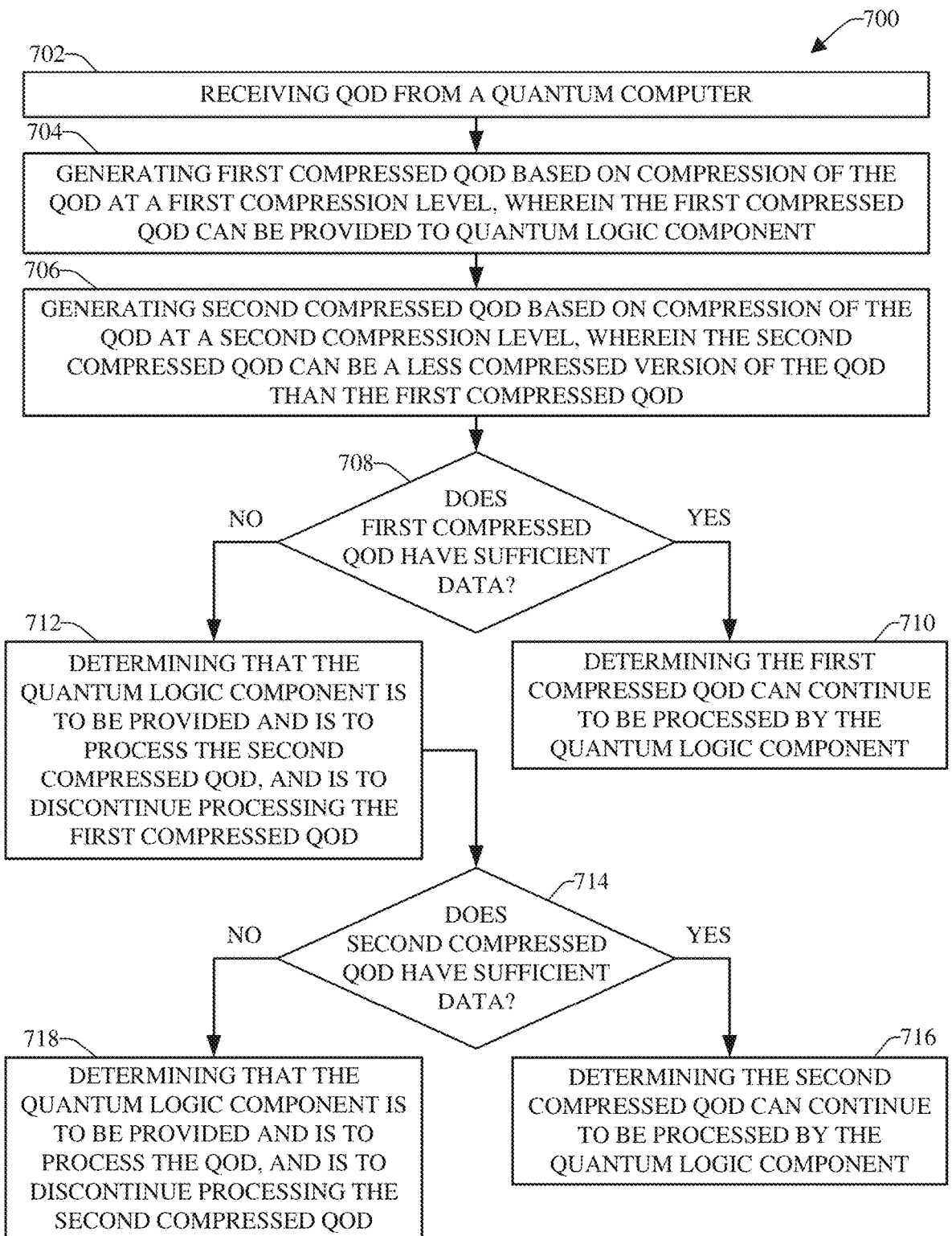
FIG. 7 depicts a flow diagram of another example, non-limiting method that control post-processing, including compression, of quantum output data output as data results from a quantum computer, in accordance with various aspects and embodiments of the disclosed subject matter.

FIG. 7 depicts a flow diagram of another example, non-limiting method 700 that control post-processing, including compression, of QOD output as data results from a quantum computer, in accordance with various aspects and embodiments of the disclosed subject matter. The method 700 can be performed by, for example, a CMC, a compressor component, and/or a processor component, which can be associated with a data store. Repetitive description of like elements employed in other embodiments described herein is or may be omitted for sake of brevity.

At 702, QOD can be received from a quantum computer. The compressor component and/or CMC can receive the QOD from the quantum computer, which can comprise a collection of quantum circuits and quantum devices. A quantum program can execute instructions to utilize desired quantum circuits and quantum devices of the quantum computer to perform operations (e.g., quantum computing operations) on input data and/or other data (e.g., other relevant data). Based at least in part on the performance of such operations on the input data and/or other data, the quantum computer or quantum program can determine and generate, as an output, the QOD.

At 704, first compressed QOD can be generated based at least in part on compression of the QOD at a first compression level, wherein the first compressed QOD can be provided to quantum logic component. The QOD can be converted from an analog form (e.g., analog signal) to a digital form (e.g., digital signal) by an ADC component. The compressor component can receive the QOD (e.g., in digital form). The CMC can control compression of the QOD to have the compressor component (e.g., employing a first compressor sub-component) compress the QOD at the first compression level. Based at least in part on the compression of the QOD at the first compression level, the compressor component can generate the first compressed QOD, which can have a first data resolution. The compressor component can provide the first compressed QOD to the quantum logic component for further processing by the quantum logic component.

At 706, second compressed QOD can be generated based at least in part on compression of the QOD at a second compression level, wherein the second compressed QOD can be a less compressed version of the QOD than the first compressed QOD. The CMC also can control compression of the QOD to have the compressor component (e.g., employing a second compressor sub-component) compress the QOD at the second compression level. Based at least in part on the compression of the QOD at the second compression level, the compressor component can generate the second compressed QOD, which can have a second data resolution that can be higher than the first data resolution. In some embodiments, the compressor component can provide the second compressed QOD to the quantum logic component in parallel with the first compressed QOD. Typically, while processing the first compressed QOD, if the quantum logic component also receives the second compressed QOD, the quantum logic component will not process the second compressed QOD, but will store the second compressed QOD until it is processed or discarded.

In certain embodiments, as more fully described herein, the CMC can employ the machine learning component to adaptively determine, infer, or learn a second compression level that can be used to compress the QOD to produce (e.g., at least it is predicted to produce) second compressed QOD that can include sufficient data such that it can be desirably processed (e.g., suitably or properly processed) by the quantum logic component, in accordance with (e.g., to satisfy) a defined quantum logic processing criterion, which can indicate whether a stream of compressed data includes sufficient data to enable it to be suitably or properly processed by the quantum logic component. The machine learning component can perform a machine learning analysis on a portion (e.g., available portion) of the first compressed QOD, previous data results (e.g., from previous job requests) and/or other information from the quantum circuits, and/or feedback information relating to the first compressed QOD, which can be received from the quantum logic component. Based at least in part on the results of the machine learning analysis, the machine learning component can adaptively determine, infer, or learn such a second compression level that can be used to facilitate producing (e.g., or is predicted to be able to facilitate producing) second compressed QOD that can include sufficient data such that it can be desirably processed by the quantum logic component, in accordance with the defined quantum logic processing criterion.

At 708, a determination can be made regarding whether the first compressed QOD includes sufficient data to be processed by the quantum logic component, based at least in part on feedback information relating to the first compressed QOD that is received from the quantum logic component, and the defined quantum logic processing criterion. The quantum logic component can perform validation checks on the data results from processing the first compressed QOD using the quantum logic. The validation checks can indicate whether the first compressed QOD contains sufficient data (e.g., sufficient data points) to enable the quantum logic component to desirably (e.g., suitably or properly) process the first compressed QOD, using the quantum logic, to produce usable data results. The CMC can receive, from the quantum logic component, the feedback information, which can comprise information relating to the results of such validation checks. Based at least in part on the feedback information, the CMC can determine whether the first compressed QOD includes sufficient data to be desirably processed by the quantum logic component, in accordance with (e.g., to satisfy) the defined quantum logic processing criterion.

If it is determined that the first compressed QOD includes sufficient data, at 710, it can be determined that the first compressed QOD can continue to be processed by the quantum logic component. In response to the CMC determining that the first compressed QOD includes sufficient data to be desirably processed by the quantum logic component, the CMC can determine that the quantum logic component can continue to process the first compressed QOD. The CMC also can determine that the quantum logic component does not have to be provided the second compressed QOD (e.g., any longer), and the CMC can discard or facilitate discarding the second compressed QOD (and the non-compressed QOD, except for any portion of the QOD that still remains to be compressed at the first compression level). The method 700 can end at this point (if it is determined that the first compressed QOD can continue to be processed by the quantum logic component).

Referring again to reference numeral 708, if, at 708, it is determined that the first compressed QOD does not include sufficient data (e.g., to be desirably processed by the quantum logic component such that the defined quantum logic processing criterion is satisfied), at 712, it can be determined that the quantum logic component is to be provided and is to process the second compressed QOD, and is to discontinue processing the first compressed QOD. For instance, in response to determining that the first compressed QOD does not include sufficient data to be desirably processed by the quantum logic component, the CMC can determine that the quantum logic component is to be provided and is to process the second compressed QOD. The CMC also can determine that the quantum logic component can discontinue processing the first compressed QOD, and can discard or facilitate discarding the first compressed QOD, or at least any remaining portion thereof.

At 714, a determination can be made regarding whether the second compressed QOD includes sufficient data to be processed by the quantum logic component, based at least in part on feedback information relating to the second compressed QOD that is received from the quantum logic component, and the defined quantum logic processing criterion. In connection with using the quantum logic to further process the second compressed QOD, the quantum logic component can perform validation checks on the data results from such processing of the second compressed QOD. The validation checks can indicate whether the second compressed QOD contains sufficient data to enable the quantum logic component to desirably (e.g., suitably or properly) process the second compressed QOD, using the quantum logic, to produce usable data results. The CMC can receive, from the quantum logic component, the feedback information, which can comprise information relating to the results of such validation checks on the second compressed QOD. Based at least in part on such feedback information, the CMC can determine whether the second compressed QOD includes sufficient data to be desirably processed by the quantum logic component, in accordance with (e.g., to satisfy) the defined quantum logic processing criterion.

If it is determined that the second compressed QOD includes sufficient data, at 716, it can be determined that the second compressed QOD can continue to be processed by the quantum logic component. In response to the CMC determining that the second compressed QOD includes sufficient data to be desirably processed by the quantum logic component, the CMC can determine that the quantum logic component can continue to process the second compressed QOD. The CMC also can determine that the quantum logic component does not have to be provided the QOD (e.g., any longer), and the CMC can discard or facilitate discarding the QOD (e.g., the non-compressed QOD, except for any portion of the QOD that still remains to be compressed at the second compression level). The method 1200 can end at this point (if it is determined that the second compressed QOD can continue to be processed by the quantum logic component).

Referring again to reference numeral 714, if, at 714, it is determined that the second compressed QOD does not include sufficient data (e.g., sufficient data to be desirably processed by the quantum logic component such that the defined quantum logic processing criterion is satisfied), at 718, it can be determined that the quantum logic component is to be provided and is to process the QOD, and is to discontinue processing the second compressed QOD. For instance, in response to determining that the second compressed QOD does not include sufficient data to be desirably processed by the quantum logic component, the CMC can determine that the quantum logic component is to be provided and is to process the QOD (e.g., non-compressed QOD). The CMC also can determine that the quantum logic component can discontinue processing the second compressed QOD, and can discard or facilitate discarding the second compressed QOD, or at least any remaining portion thereof.

Figure 8:
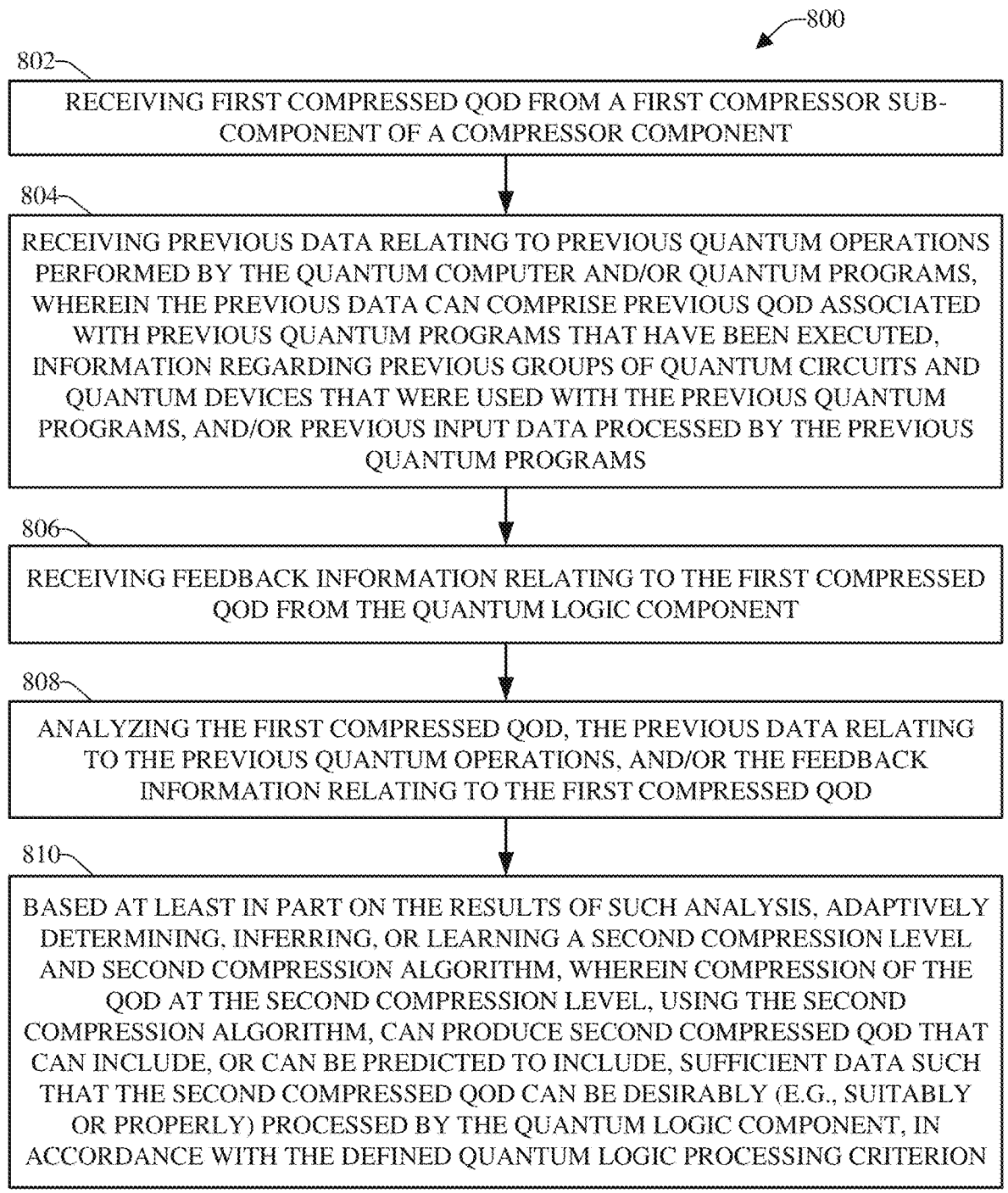
FIG. 8 illustrates a flow diagram of an example, non-limiting method that can adaptively determine a compression level and compression algorithm to use for compressing quantum output data, in accordance with various aspects and embodiments of the disclosed subject matter.

FIG. 8 illustrates a flow diagram of an example, non-limiting method 800 that can adaptively determine a compression level and compression algorithm to use for compressing QOD, in accordance with various aspects and embodiments of the disclosed subject matter. The method 800 can be performed by, for example, a CMC, a compressor component, a machine learning component, and/or a processor component, which can be associated with a data store. Repetitive description of like elements employed in other embodiments described herein is or may be omitted for sake of brevity.

At 802, first compressed QOD can be received from a first compressor sub-component of the compressor component. The first processor sub-component of the compressor component can receive QOD from the quantum computer component. Using a first compression algorithm, the first processor sub-component can compress the QOD at a first compression level to generate the first compressed QOD, which can have a first data resolution. The machine learning component can receive the first compressed QOD, or a portion of such data stream, from the first compressor sub-component.

At 804, previous data relating to previous quantum operations performed by the quantum computer and/or quantum programs can be received, wherein the previous data can comprise previous QOD associated with previous quantum programs that have been executed, information regarding previous groups of quantum circuits and quantum devices that were used with the previous quantum programs, and/or previous input data processed by the previous quantum programs. The machine learning component can receive the previous data relating to the previous quantum operations performed by the quantum computer and/or the quantum programs from a data store (e.g., a data store of the CMC, the quantum computer component, or another component of the system).

At 806, feedback information relating to the first compressed QOD can be received from the quantum logic component. In some embodiments, in connection with adaptively determining a compression level to use for compressing the QOD to satisfy the applicable defined quantum logic processing criterion, the machine learning component can receive the feedback information relating to the first compressed QOD from the quantum logic component.

At 808, the first compressed QOD, the previous data relating to the previous quantum operations, and/or the feedback information relating to the first compressed QOD can be analyzed. The machine learning component can analyze (e.g., can perform a machine learning, AI analysis, or other analysis on) the first compressed QOD, the previous data relating to the previous quantum operations, and/or the feedback information.

At 810, based at least in part on the results of such analysis, a second compression level and second compression algorithm can be adaptively determined, inferred, or learned, wherein compression of the QOD at the second compression level, using the second compression algorithm, can produce second compressed QOD that can include, or can be predicted to include, sufficient data such that the second compressed QOD can be desirably (e.g., suitably or properly) processed by the quantum logic component, in accordance with the defined quantum logic processing criterion. Based at least in part on the results of the analysis (e.g., machine learning analysis, AI analysis, or other analysis), the machine learning component can adaptively determine, infer, or learn a second compression level and second compression algorithm where compression of the QOD at the second compression level, using the second compression algorithm, can produce the second compressed QOD that can include, or can be predicted to include, sufficient data such that the second compressed QOD can be desirably (e.g., suitably or properly) processed by the quantum logic component, in accordance with (e.g., to satisfy) the defined quantum logic processing criterion.

For simplicity of explanation, the methods and/or computer-implemented methods are depicted and described as a series of acts. It is to be understood and appreciated that the disclosed subject matter is not limited by the acts illustrated and/or by the order of acts, for example acts can occur in various orders and/or concurrently, and with other acts not presented and described herein. Furthermore, not all illustrated acts can be required to implement the computer-implemented methods in accordance with the disclosed subject matter. In addition, those skilled in the art will understand and appreciate that the computer-implemented methods could alternatively be represented as a series of interrelated states via a state diagram or events. Additionally, it should be further appreciated that the computer-implemented methods disclosed hereinafter and throughout this specification are capable of being stored on an article of manufacture to facilitate transporting and transferring such computer-implemented methods to computers. The term article of manufacture, as used herein, is intended to encompass a computer program accessible from any computer-readable device or storage media.

Figure 9:
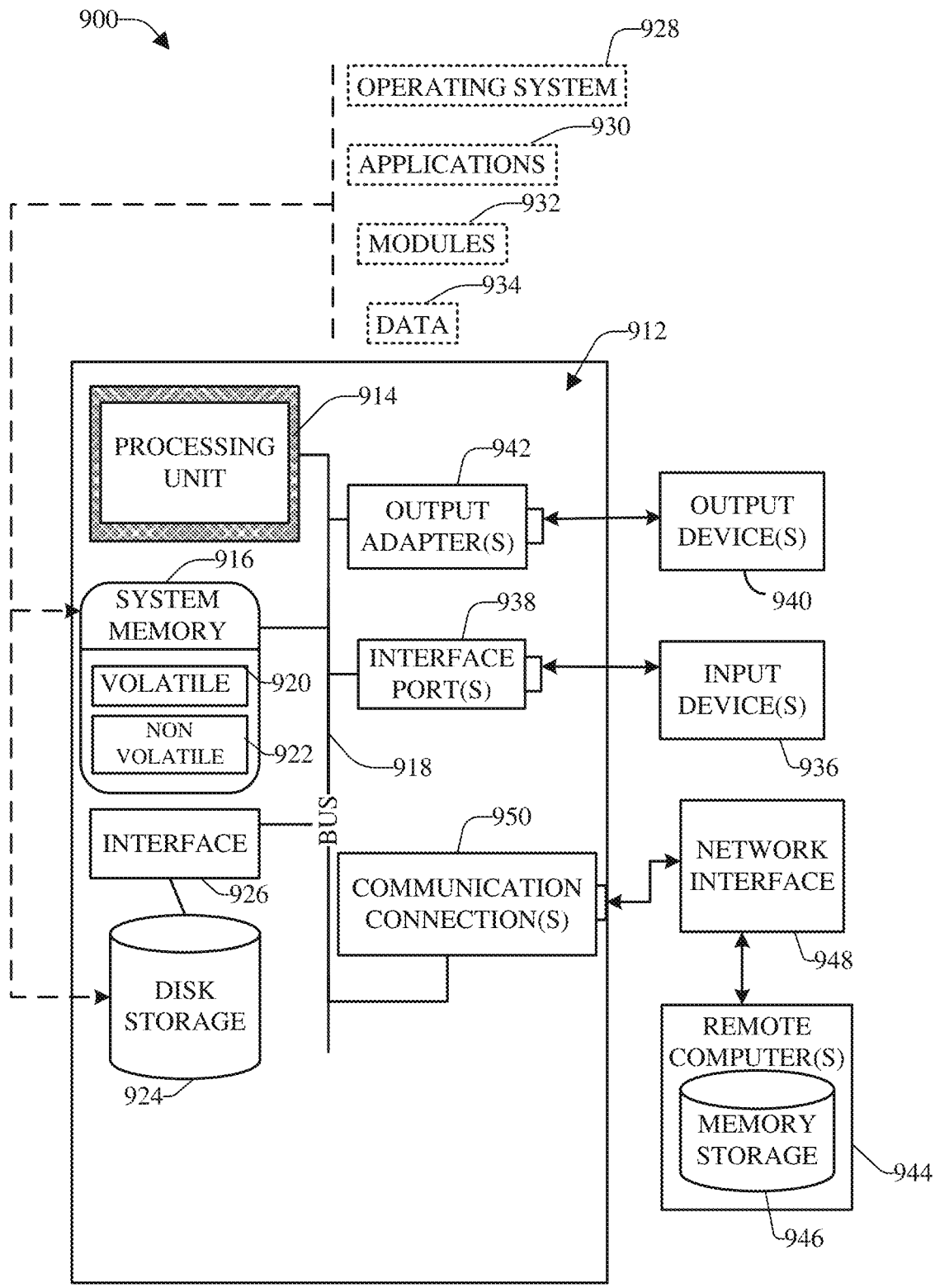
FIG. 9 illustrates a block diagram of an example, non-limiting operating environment in which one or more embodiments described herein can be facilitated.

In order to provide a context for the various aspects of the disclosed subject matter, FIG. 9 as well as the following discussion are intended to provide a general description of a suitable environment in which the various aspects of the disclosed subject matter can be implemented. FIG. 9 illustrates a block diagram of an example, non-limiting operating environment in which one or more embodiments described herein can be facilitated. Repetitive description of like elements employed in other embodiments described herein is or may be omitted for sake of brevity. With reference to FIG. 9, a suitable operating environment 900 for implementing various aspects of this disclosure can also include a computer 912. The computer 912 can also include a processing unit 914, a system memory 916, and a system bus 918. The system bus 918 couples system components including, but not limited to, the system memory 916 to the processing unit 914. The processing unit 914 can be any of various available processors. Dual microprocessors and other multiprocessor architectures also can be employed as the processing unit 914. The system bus 918 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI). The system memory 916 can also include volatile memory 920 and nonvolatile memory 922. The basic input/output system (BIOS), containing the basic routines to transfer information between elements within the computer 912, such as during start-up, is stored in nonvolatile memory 922. By way of illustration, and not limitation, nonvolatile memory 922 can include read only memory (ROM), programmable ROM (PROM), electrically programmable ROM (EPROM), electrically erasable programmable ROM (EEPROM), flash memory, or nonvolatile random access memory (RAM) (e.g., ferroelectric RAM (FeRAM)). Volatile memory 920 can also include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM.

Computer 912 also can include removable/non-removable, volatile/non-volatile computer storage media. FIG. 9 illustrates, for example, a disk storage 924. Disk storage 924 can also include, but is not limited to, devices like a magnetic disk drive, floppy disk drive, tape drive, Jaz drive, Zip drive, LS-100 drive, flash memory card, or memory stick. The disk storage 924 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 924 to the system bus 918, a removable or non-removable interface is typically used, such as interface 926. FIG. 9 also depicts software that acts as an intermediary between users and the basic computer resources described in the suitable operating environment 900. Such software can also include, for example, an operating system 928. Operating system 928, which can be stored on disk storage 924, acts to control and allocate resources of the computer 912. System applications 930 take advantage of the management of resources by operating system 928 through program modules 932 and program data 934, e.g., stored either in system memory 916 or on disk storage 924. It is to be appreciated that this disclosure can be implemented with various operating systems or combinations of operating systems. A user enters commands or information into the computer 912 through input device(s) 936. Input devices 936 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 914 through the system bus 918 via interface port(s) 938. Interface port(s) 938 include, for example, a serial port, a parallel port, a game port, and a universal serial bus (USB). Output device(s) 940 use some of the same type of ports as input device(s) 936. Thus, for example, a USB port can be used to provide input to computer 912, and to output information from computer 912 to an output device 940. Output adapter 942 is provided to illustrate that there are some output devices 940 like monitors, speakers, and printers, among other output devices 940, which require special adapters. The output adapters 942 include, by way of illustration and not limitation, video and sound cards that provide a method of connection between the output device 940 and the system bus 918. It should be noted that other devices and/or systems of devices provide both input and output capabilities such as remote computer(s) 944.

Computer 912 can operate in a networked environment using logical connections to one or more remote computers, such as remote computer(s) 944. The remote computer(s) 944 can be a computer, a server, a router, a network PC, a workstation, a microprocessor based appliance, a peer device or other common network node and the like, and typically can also include many or all of the elements described relative to computer 912. For purposes of brevity, only a memory storage device 946 is illustrated with remote computer(s) 944. Remote computer(s) 944 is logically connected to computer 912 through a network interface 948 and then physically connected via communication connection 950. Network interface 948 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 950 refers to the hardware/software employed to connect the network interface 948 to the system bus 918. While communication connection 950 is shown for illustrative clarity inside computer 912, it can also be external to computer 912. The hardware/software for connection to the network interface 948 can also include, for exemplary purposes only, internal and external technologies such as, modems including regular telephone grade modems, cable modems and DSL modems, ISDN adapters, and Ethernet cards.

One or more embodiments can be a system, a method, an apparatus and/or a computer program product at any possible technical detail level of integration. The computer program product can include a computer readable storage medium (or media) having computer readable program instructions thereon for causing a processor to carry out aspects of the one or more embodiments. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the disclosed subject matter can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the disclosed subject matter.

Aspects of disclosed subject matter are described herein with reference to flowchart illustrations and/or block diagrams of methods, apparatus (systems), and computer program products according to embodiments of the subject disclosure. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create method for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the disclosed subject matter. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can be implemented in combination with other program modules. Generally, program modules include routines, programs, components, data structures, etc. that perform particular tasks and/or implement particular abstract data types. Moreover, those skilled in the art will appreciate that the computer-implemented methods disclosed herein can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like.

The illustrated aspects can also be practiced in distributed computing environments where tasks are performed by remote processing devices that are linked through a communications network. However, some, if not all aspects of this disclosure can be practiced on stand-alone computers. In a distributed computing environment, program modules can be located in local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other method to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," "data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM)). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system, comprising:
   a memory that stores computer-executable components; and
   a processor, operatively coupled to the memory, that executes computer-executable components, the computer-executable components comprising:
      a compressor component that, in response to receiving quantum output data, generates first compressed quantum output data based on compression of the quantum output data at a first compression level, wherein the first compressed quantum output data is provided to quantum logic; and
      a compression management component that determines whether the first compressed quantum output data includes an amount of data that satisfies a defined threshold amount of data to enable the first compressed quantum output data to be processed by the quantum logic, based on a defined quantum logic processing criterion, to determine whether the quantum logic is to process second compressed quantum output data that is a less compressed version of the quantum output data than the first compressed quantum output data.

2. The system of claim 1, wherein the compressor component generates the second compressed quantum output data based on compression of the quantum output data at a second compression level, wherein the second compressed quantum output data has a second data resolution level that is higher than a first data resolution level of the first compressed quantum output data.

3. The system of claim 2, wherein, in response to determining that the first compressed quantum output data includes the amount of data that satisfies the defined threshold amount of data, based on the defined quantum logic processing criterion, the compression management component determines that the second compressed quantum output data is to be discarded and data compression relating to the second compression level is to be discontinued.

4. The system of claim 2, wherein, in response to determining that the first compressed quantum output data does not include the amount of data sufficient to satisfy the defined threshold amount of data, the compression management component determines that the second compressed quantum output data is to be processed by the quantum logic and facilitates providing the second compressed quantum output data to the quantum logic for quantum logic processing.

5. The system of claim 4, wherein the compression management component determines whether the second compressed quantum output data includes the amount of data that satisfies the defined threshold amount of data to enable the second compressed quantum output data to be processed by the quantum logic, based on the defined quantum logic processing criterion, to determine whether the quantum output data is to be processed by the quantum logic.

6. The system of claim 5, wherein, in response to determining that the second compressed quantum output data does not include the amount of data sufficient to satisfy the defined threshold amount of data, the compression management component determines that the quantum output data is to be processed by the quantum logic and facilitates providing the quantum output data to the quantum logic for the quantum logic processing.

7. The system of claim 1, wherein the compressor component comprises a first compressor sub-component and a second compressor sub-component, wherein the first compressor sub-component is linked with the second compressor sub-component, wherein the first compressor sub-component generates the first compressed quantum output data based on the compression of the quantum output data at the first compression level, wherein the second compressor sub-component generates the second compressed quantum output data based on compression of the quantum output data at a second compression level, and wherein the second compression level is determined based on the first compressed quantum output data.

8. The system of claim 7, wherein the computer-executable components further comprise a machine learning component that adaptively determines or infers the second compression level and a compression algorithm to be used by the second compressor sub-component based on a result of performing a machine learning analysis on the first compressed quantum output data, previous data associated with previous quantum operations or a previous quantum program, or information relating to quantum circuits utilized by a quantum program to facilitate generation of the quantum output data or utilized by the previous quantum program to facilitate generation of previous quantum output data.

9. The system of claim 1, wherein the computer-executable components further comprise a machine learning component that infers or determines a compression level, a corresponding data resolution level, and a corresponding compression algorithm that will produce compressed quantum output data that is sufficient to satisfy the defined threshold amount of data or a defined threshold data resolution level to enable the compressed quantum output data to be processed by the quantum logic, based on a result of performing a machine learning analysis on the quantum output data, previous data associated with previous quantum operations or a previous quantum program, or information relating to quantum circuits utilized by a quantum program to facilitate generation of the quantum output data or utilized by the previous quantum program to facilitate generation of previous quantum output data.

10. The system of claim 1, wherein the computer-executable components further comprise a quantum program component that, in response to execution of a quantum program, generates the quantum output data based on input data that is input to the quantum program, and wherein the quantum program component provides the quantum output data to the compressor component.

11. The system of claim 10, wherein the quantum program processes the input data, utilizing a set of quantum circuits, comprising quantum computing devices, and generates the quantum output data based on the processing of the input data.

12. A computer-implemented method, comprising:
   in response to receiving quantum output information, generating, by a system operatively coupled to a processor, first compressed quantum output information based on compressing the quantum output information at a first compression level, wherein the first compressed quantum output information is communicated to quantum logic; and
   determining, by the system, whether the first compressed quantum output information has an amount of information that satisfies a defined threshold amount of information to enable the first compressed quantum output information to be processed by the quantum logic, in accordance with a defined quantum logic processing criterion, to determine whether the quantum logic is to process second compressed quantum output information that is a less compressed version of the quantum output information than the first compressed quantum output information.

13. The computer-implemented method of claim 12, further comprising:
in response to determining that the first compressed quantum output information has the amount of information that satisfies the defined threshold amount of information, in accordance with the defined quantum logic processing criterion, determining, by the system, that the second compressed quantum output information is to be discarded and information compression relating to the quantum output information is to be terminated.

14. The computer-implemented method of claim 12, further comprising:
in response to determining that the first compressed quantum output information does not have the amount of information to satisfy the defined threshold amount of information, determining, by the system, that the second compressed quantum output information is to be processed by the quantum logic; and
communicating, by the system, the second compressed quantum output information to the quantum logic for quantum logic processing.

15. The computer-implemented method of claim 14, further comprising:
generating, by the system, the second compressed quantum output information based on compressing the quantum output information at a second compression level, wherein the second compressed quantum output information has a second information resolution that is higher than a first information resolution of the first compressed quantum output information, and wherein the quantum output information is generated based on processing input information using a quantum program; and
determining, by the system, whether the second compressed quantum output information has the amount of information that satisfies the defined threshold amount of information, in accordance with the defined quantum logic processing criterion, to determine whether the quantum output information or third compressed quantum output information is to be processed by the quantum logic.

16. The computer-implemented method of claim 15, further comprising:
in response to determining that the second compressed quantum output information does not have the amount of information to satisfy the defined threshold amount of information, determining, by the system, that the quantum output information is to be processed by the quantum logic; and
communicating, by the system, the quantum output information to the quantum logic for quantum logic processing.

17. The computer-implemented method of claim 15, further comprising:
generating, by the system, the third compressed quantum output information based on compressing the quantum output information at a third compression level, wherein the third compressed quantum output information has a third information resolution that is higher than the second information resolution, wherein the third compressed quantum output information is a less compressed version of the quantum output information than the second compressed quantum output information.

18. The computer-implemented method of claim 15, further comprising:
in response to determining that the second compressed quantum output information does not have the amount of information to satisfy the defined threshold amount of information, determining, by the system, that the third compressed quantum output information is to be processed by the quantum logic for the quantum logic processing; and
communicating, by the system, the third compressed quantum output information to the quantum logic for the quantum logic processing.

19. A computer program product that facilitates compressing quantum output data generated by a quantum computing circuit, the computer program product comprising a computer readable storage medium having program instructions embodied therewith, the program instructions are executable by a processor to cause the processor to:
in response to receiving the quantum output data, generate first compressed quantum output data, based on compression of the quantum output data at a first compression level, wherein the first compressed quantum output data is provided to quantum logic; and
determine whether the first compressed quantum output data includes an amount of data points, associated with the quantum output data, that satisfies a defined threshold amount of data points to enable the first compressed quantum output data to be processed by the quantum logic, in accordance with a defined quantum logic processing criterion, to determine whether the quantum logic is to process second compressed quantum output data that is a less compressed version of the quantum output data than the first compressed quantum output data.

20. The computer program product of claim 19, wherein the quantum output data is generated based on processing input data using a quantum program associated with the quantum computing circuit, and wherein the program instructions are executable by the processor to cause the processor to:
one of:
in response to determining that the first compressed quantum output data includes the amount of the data points that satisfies the defined threshold amount of data points, in accordance with the defined quantum logic processing criterion, determine that the second compressed quantum output data is to be discarded and data compression relating to the quantum output data is to be discontinued; or
in response to determining that the first compressed quantum output data does not include the amount of the data points to satisfy the defined threshold amount of data points, determine that the second compressed quantum output data is to be processed by the quantum logic, wherein the second compressed quantum output data has a second data resolution that is higher than a first data resolution of the first compressed quantum output data, and
transmit the second compressed quantum output data to the quantum logic for quantum logic processing.

* * * * *